United States Patent [19]
Fukuda et al.

[11] Patent Number: 5,780,328
[45] Date of Patent: Jul. 14, 1998

[54] PROCESS FOR PRODUCING SEMICONDUCTOR INTEGRATED CIRCUIT

[75] Inventors: Kazushi Fukuda, Kodaira; Yasuko Yoshida, Sayama; Yutaka Hoshino, Higashimurayama; Naotaka Hashimoto, Koganei; Kyoichiro Asayama, Higashiyamato; Yuuki Koide, Akishima; Keiichi Yoshizumi, Kokubunji; Eri Okamoto, Kodaira; Satoru Haga, Akishima; Shuji Ikeda, Koganei, all of Japan

[73] Assignees: Hitachi, Ltd.; Hitachi ULSI Engineering Co., Ltd., both of Tokyo, Japan

[21] Appl. No.: 835,197

[22] Filed: Apr. 7, 1997

Related U.S. Application Data

[63] Continuation of Ser. No. 675,149, Jul. 3, 1996, abandoned.

[30] Foreign Application Priority Data

Jul. 11, 1995 [JP] Japan .................. 7-175240

[51] Int. Cl.⁶ .................. H01L 21/8238; H01L 21/336

[52] U.S. Cl. .................. 438/201; 438/257
[58] Field of Search .................. 438/201, 257

[56] References Cited

U.S. PATENT DOCUMENTS

| | | | |
|---|---|---|---|
| 5,188,976 | 2/1993 | Kume et al. | 437/43 |
| 5,407,853 | 4/1995 | Komori et al. | 437/52 |

FOREIGN PATENT DOCUMENTS 61-241967  10/1986  Japan.

*Primary Examiner*—Brian Dutton
*Attorney, Agent, or Firm*—Antonelli, Terry, Stout & Kraus, LLP

[57] ABSTRACT

When the source and drain regions (an n⁻ type semiconductor region and an n⁺ type semiconductor region) of a complementary MISFET and a p-type semiconductor region for use as a punch-through stopper are formed in a p-type well in a substrate having a p- and an n-type well, p-type impurities for the punch-through stopper are suppressed from being supplied to the feeding portion (an n⁺ type semiconductor region) of the n-type well.

20 Claims, 24 Drawing Sheets

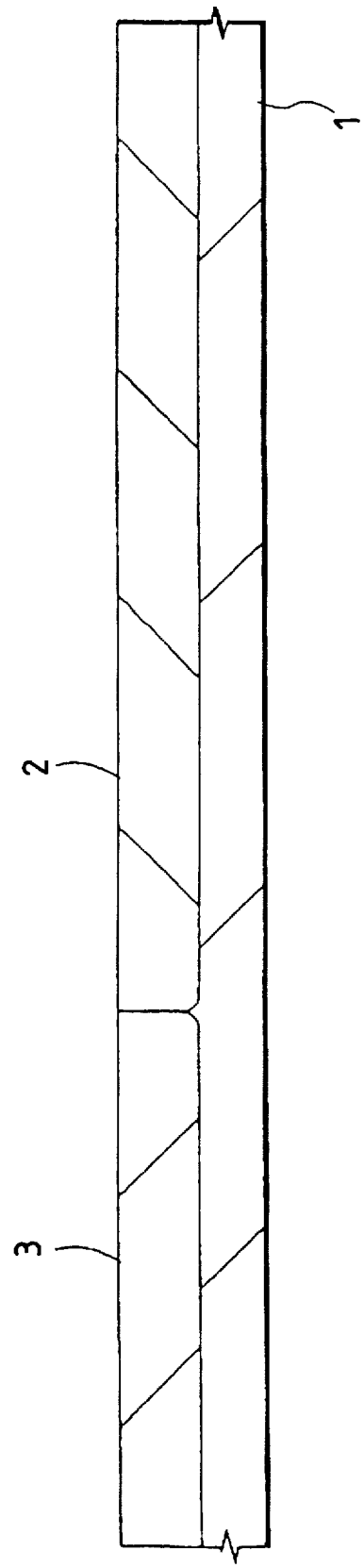
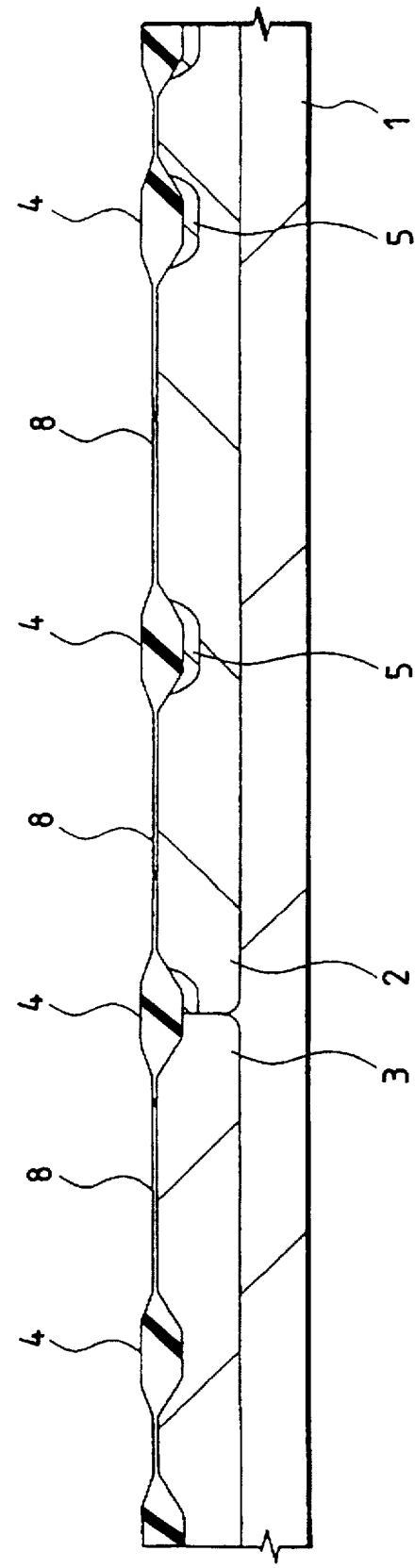

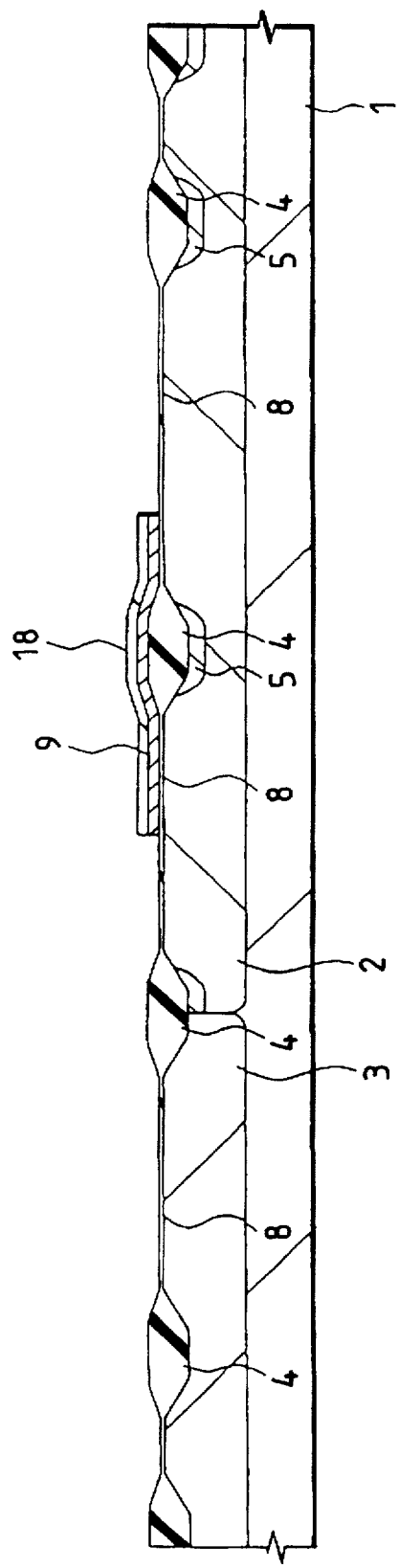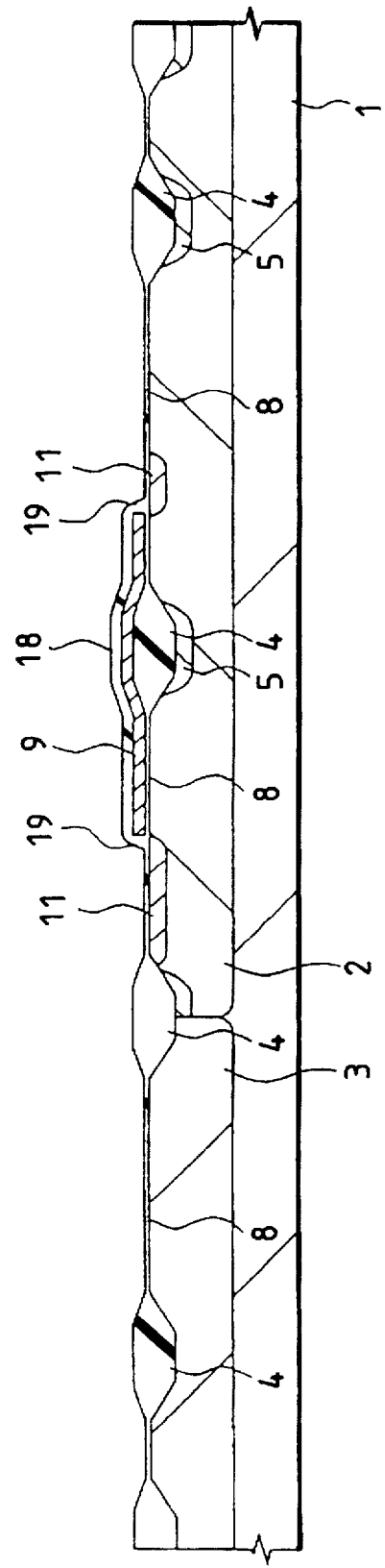

FIG. 24(a)
FIG. 24(b)
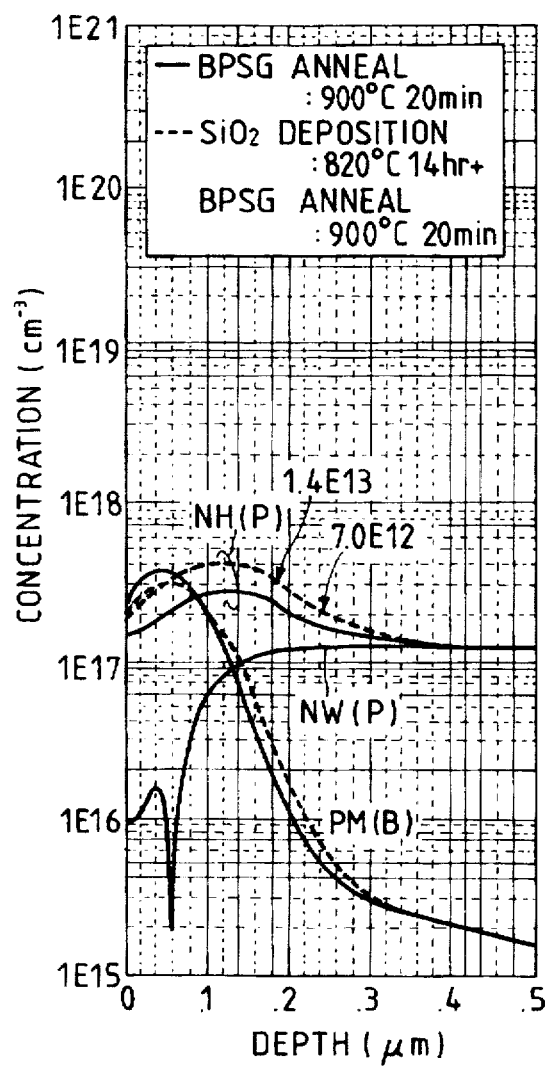
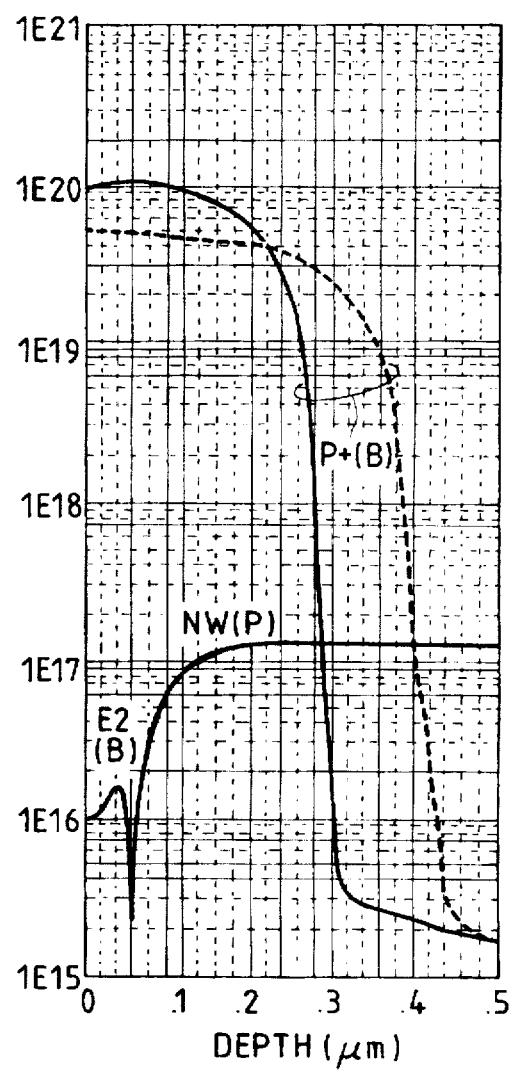

NH ION P⁺ 150 KeV
NH DOSE $5.0 \times 10^{12} \sim 2.0 \times 10^{13}$ atom/cm²

NH ION P⁺ 7E12
NH ENERGY 50~210 KeV 5,780,328

1

PROCESS FOR PRODUCING SEMICONDUCTOR INTEGRATED CIRCUIT

This application is a continuation application of application Ser. No. 08/675,149, filed Jul. 3, 1996, now abandoned.

BACKGROUND OF THE INVENTION

The present invention relates to a semiconductor integrated circuit and a process for producing the same, and more particularly to technology effectively applicable to a semiconductor integrated circuit having miniaturized MISFETs (Metal Insulator Semiconductor Field Effect Transistors).

Various LSIs in such as memories and microprocessors are integrated circuits of the sort formed with mainly MISFETs. Therefore, the art of miniaturizing, and increasing the performance of, such MISFETs is indispensable to the development of high-integration and high-performance LSIs.

However, the hot-carrier effect, the short channel effect, the punch-through and the like cause potential problems when attempts are made to increase the miniaturization of MISFETs. The hot-carrier effect is associated with a phenomenon in which when channel hot electrons generated in the high electric field area of the end portion of the drain region are trapped in a gate insulating film, the channel current decreases and the threshold voltage Vth rises. Further, the short channel effect is associated with a phenomenon in which the threshold voltage Vth lowers as a depletion layer extending from the drain region affects the end of the depletion layer of the source region, and the drain voltage is put in charge of part of the total quantity of acceptors needed to form an inverted layer, thus this making it unnecessary to apply the gate voltage to the extent that the drain voltage is responsible as stated above. Consequently, the influence of the depletion layer of the drain region appears in such a way that the threshold voltage lowers when the channel length is reduced. Further, the punch-through is associated with a phenomenon in which the gate voltage becomes uncontrollable since the depletion layers of the source and drain regions come in contact with each other when the channel length is shortened because of miniaturization.

The art of suppressing the hot-carrier effect of the MISFET has been materialized by the well known LDD (Lightly Doped Drain) structure for easing the electric field of the end portion of the drain region by forming the source and drain regions with semiconductor regions each of low and high impurity concentration.

Further, the proposed art of suppressing the punch-through is to provide a third semiconductor region in a substrate beneath a semiconductor region of low impurity concentration forming the source and drain regions, the third semiconductor region being different in conductivity type from the semiconductor region (i.e., of the same conductivity type as that of the substrate) and higher in impurity concentration than the substrate. Since the third semiconductor region acts to suppress the elongation of the p-n junction depletion layer formed with respect to the semiconductor region of low impurity concentration formed thereon, the punch-through can effectively be suppressed.

For example, laid-open Patent Publication No. 241967/1986 discloses a MISFET structure for suppressing the punch-through by forming the source and drain regions of an n-channel MISFET with an n⁻ type semiconductor region of

2 low impurity concentration and an n⁺ type semiconductor region of high impurity concentration so as to suppress the hot-carrier effect and by providing a p⁺ type semiconductor region of impurity concentration higher than that of a p-type well beneath the n⁻ type semiconductor region.

SUMMARY OF THE INVENTION

The MISFET structure referred to in laid-open Patent Publication No. 241967/1986 is attainable through the steps of forming gate electrodes on the respective main surfaces of a p-type and an n-type wells, forming a p-type semiconductor region by implanting p-type impurities in the p-type well with a first photoresist covering a p-channel type MISFET forming area as a mask, and then forming an n⁻ type semiconductor region (the source and drain regions of low impurity concentration) on the p-type semiconductor region by implanting n-type impurities in the p-type well with the photoresist as a mask.

Subsequently, a sidewall spacer is formed on the sidewall of the gate electrode by anisotropically etching the silicon oxide film built up on a semiconductor substrate and then an n⁺ type semiconductor region (the source and drain regions of high impurity concentration) is formed by implanting the n-type impurities in the p-type well with a second photoresist covering the p-channel type MISFET forming area as a mask. When the p-type semiconductor region is thus formed beneath the n⁻ type semiconductor region of the p-channel type MISFET, the same photoresist mask is used to implant the p- and n-type impurities to form the n⁻ type semiconductor region and the p-type semiconductor region in order to prevent an increase in the number of masking steps. In other words, it is common practice to form the p-type semiconductor region by ion implantation using the same photoresist mask since the p-type semiconductor region is formed beneath the n⁻ type semiconductor region.

As far as the present inventors have studied, however, the properties of a feeding portion are deteriorated when p- and n-type impurities are implanted in the p-type well as mentioned above because the impurities of a conductivity type (p-type impurities) different from those to be implanted in the feeding portion of the n-type well are implanted therein. In consequence, it has become clear that the supply of potential to the n-type well is made difficult accordingly. When the p⁻ type semiconductor region (the source and drain regions of low impurity concentration) of the p-channel type MISFET in the n-type well in the same manner as mentioned above and when an n-type semiconductor region of impurity concentration higher than that of the n-type well is formed beneath the p⁻ type semiconductor region, a similar problem is also caused to the p-type well as in the preceding case because the impurities of a conductivity type different from those in the p-type well (n-type impurities) are implanted in the feeding portion of the p-type well. Referring to FIGS. 24–28, there will subsequently be given a description of that phenomena. Incidentally, a SRAM having a MISFET of this kind has been referred to in, for example, U.S. Ser. No. 08/181,545 applied to the U.S. Patent Office on Jan. 14, 1994.

As shown in FIG. 28(a), a p⁺ type semiconductor region (p⁺) (and a p⁻ type semiconductor region (PM)) constitute the feeding portion PWS of a p-type well and when n-type impurities are implanted in the feeding portion to form an n-type semiconductor region (NH), the feeding portion exhibits impurity distribution as shown in FIGS. 24(a), (b). FIG. 24(a) shows the impurity distribution in the p⁻ type semiconductor region (PM) and the n-type semiconductor region (NH), whereas FIG. 24(b) shows the impurity distribution in the p⁺ type semiconductor region (p⁺); in this case, it is assumed that the p⁺ type semiconductor region (p⁺) and the p⁻ type semiconductor region (PM) are formed by implanting, for example, boron (B) ions, whereas an n⁻ type semiconductor region (NM) is formed by implanting, for example, P (phosphorus) ions.

Although no problem will be posed as far as the bottom portion of the n-type semiconductor region (NH) formed in the feeding portion of the p-type well is sufficiently shallower than that of the p⁺ type semiconductor region (p⁺), the latchup properties deteriorates (FIG. 28(b)) when the depth of the bottom portion of the n-type semiconductor region (NH) becomes substantially equal to that of the bottom portion of the p⁺ type semiconductor region (p⁺) because a bipolar transistor (pnp junction) parasitic on the p-type well is formed. When the bottom portion of the n-type semiconductor region (NH) becomes deeper than that of the p⁺ type semiconductor region (p⁺) so as to surround the p⁺ type semiconductor region (p⁺), the p-type well is rendered afloat, so that no potential can be supplied via the feeding portion to the p-type well. (FIG. 28(c)).

FIG. 25 is a graph showing the impurity dosage dependence of conducting properties ($I_{GS}$-$V_{GS}$). FIG. 26 is a graph showing the impurity does energy dependence of conducting properties ($I_{GS}$-$V_{GS}$). As shown in these graphs, it has been proved that the conducting properties are deteriorated in either case where the dosage of the n-type semiconductor region (NH) is high (FIG. 25) or where the dose energy of the n-type semiconductor region (NH) is large. Since the n-type semiconductor region (NH) ought to be situated beneath the p⁻ type semiconductor region (PM) of p-channel type MISFET, it is formed by implanting high-energy, high dosage impurity ions, whereby its bottom portion tends to be deeper than the bottom portion of the p⁺ type semiconductor region (p⁺).

Moreover, the junction depth of the n-type semiconductor region (NH) also tends to vary with slight fluctuation in the heat treatment (annealing) time and consequently as shown in FIG. 27, the well potential supply dependence of the subthreshold characteristics ($I_{ds}$-$V_{Gs}$) becomes greater in the system of supplying potential (V-sub) via the feeding portion (pw-pad) to the well in comparison with the system of supplying the potential (V-sub) via the substrate (p-sub) to the well.

Although the above description is concerned with the feeding portion of the p-type well, a similar problem is also caused to the feeding portion of the n-type well. An object of the present invention is to provide a process for technically preventing the properties of the feeding portion of a substrate (well) from deteriorating in a semiconductor integrated circuit having miniaturized MISFETs.

Another object of the present invention is to provide a process for technically accomplishing the object above without increasing the number of steps in the manufacture of semiconductor integrated circuits having MISFETs.

These and other objects, and novel features of the present invention will become more apparent as the description proceeds taken in conjunction with the accompanying drawings.

A brief description will subsequently given of a representative embodiment of the present invention disclosed in the present application.

(1) A process for producing a semiconductor integrated circuit having:

a semiconductor substrate having a first semiconductor region of a first conductivity type and a second semiconductor region of a second conductivity type, a first MISFET formed in the first semiconductor region, and a second MISFET formed in the second semiconductor region;

the process comprising the steps of:

(a) preparing the semiconductor substrate having the first semiconductor region of the first conductivity type and the second semiconductor region of the second conductivity type, the semiconductor substrate having a first gate electrode on the first MISFET forming area of the first semiconductor region via a first gate insulating film and a second gate electrode on the second MISFET forming area of the second semiconductor region via a second gate insulating film;

(b) forming a third semiconductor region of the second conductivity type in the first semiconductor region on both sides of the first gate electrode by introducing impurities into the first MISFET forming area with a first mask film covering the feeding-portion forming areas of the second MISFET forming area and the second semiconductor region as a mask;

(c) forming a fourth semiconductor region of the first conductivity type beneath the third semiconductor region by introducing the impurities in the first MISFET forming area with the first mask film as a mask, the impurity concentration in the fourth semiconductor region being higher than that in the first semiconductor region; and (d) forming a fifth semiconductor region of the second conductivity type in the first semiconductor region on both sides of the first gate electrode by introducing the impurities into the first MISFET forming area and the feeding-portion forming area of the second semiconductor region with a second mask film covering the second MISFET forming area and having an opening in the feeding-portion forming area of the second semiconductor region as a mask, and forming a sixth semiconductor region of the second conductivity type in the feeding-portion forming area of the second semiconductor region. The third semiconductor region is formed between the fifth semiconductor region and the channel forming area of the first MISFET and the impurity concentration in the fifth semiconductor region is higher than that in the third semiconductor region. The junction depth of the fifth semiconductor region is greater than that of the third semiconductor region and the impurity concentration in the sixth semiconductor region is higher than that in the second semiconductor region. A first fixed potential is supplied via the sixth semiconductor region to the second semiconductor region.

(2) The bottom portion of the fourth semiconductor region is made substantially equal in depth to that of the fifth semiconductor region.

According to the aforementioned means, not only the deterioration of the latchup properties of the feeding portion but also the floating of the substrate in the feeding portion is prevented since no pn junction is formed in the feeding portion, so that the purpose of increasing the performance of such a semiconductor integrated circuit having MISFETs is achievable.

According to the aforementioned means, the parasitic capacitance formed between the fourth semiconductor region and the substrate and that formed between the fifth semiconductor region and the substrate are reduced since the bottom portion of the fourth semiconductor region of the first conductivity type is made substantially equal in depth to that of the fifth semiconductor region of high impurity concentration, so that high-speed operation of a semiconductor integrated circuit having MISFETs is achievable.

According to the aforementioned means, the pn junction can be prevented from being formed in the feeding portion without increasing the number of processing steps by effecting ion implantation for the formation of the fourth semiconductor region of the first conductivity type and the third semiconductor region of the second conductivity type and of the low impurity concentration on the semiconductor substrate with the same first mask film (photoresist) as a mask, and ion implantation for the formation of the fifth semiconductor region of the second conductivity type on the semiconductor substrate and for the formation of the sixth semiconductor region of the second conductivity type on the semiconductor substrate in the third region with the same second mask film (photoresist) as a mask.

BRIEF DESCRIPTION OF THE DRAWINGS

FIG. 3 is a sectional view of the principal part illustrative of a process for producing the SRAM according to the present invention.

FIG. 4 is a sectional view of the principle part illustrative of the process for producing the SRAM according to the present invention.

FIG. 5 is a sectional view of the principal part illustrative of the process for producing the SRAM according to the present invention.

FIG. 6 is a sectional view of the principal part illustrative of the process for producing the SRAM according to the present invention.

FIG. 24($a$) is a graph showing the impurity distribution in a semiconductor substrate in an area where a MISFET is formed; and FIG. 24($b$) is a graph showing the impurity distribution in a semiconductor substrate in an area where a feeding portion is formed. In FIGS. 24($a$), 24($b$), depth from the main surface of the substrate is shown on the abscissa axis, whereas impurity concentration is shown on the ordinate axis.

DESCRIPTION OF THE PREFERRED EMBODIMENT

Figure 1:
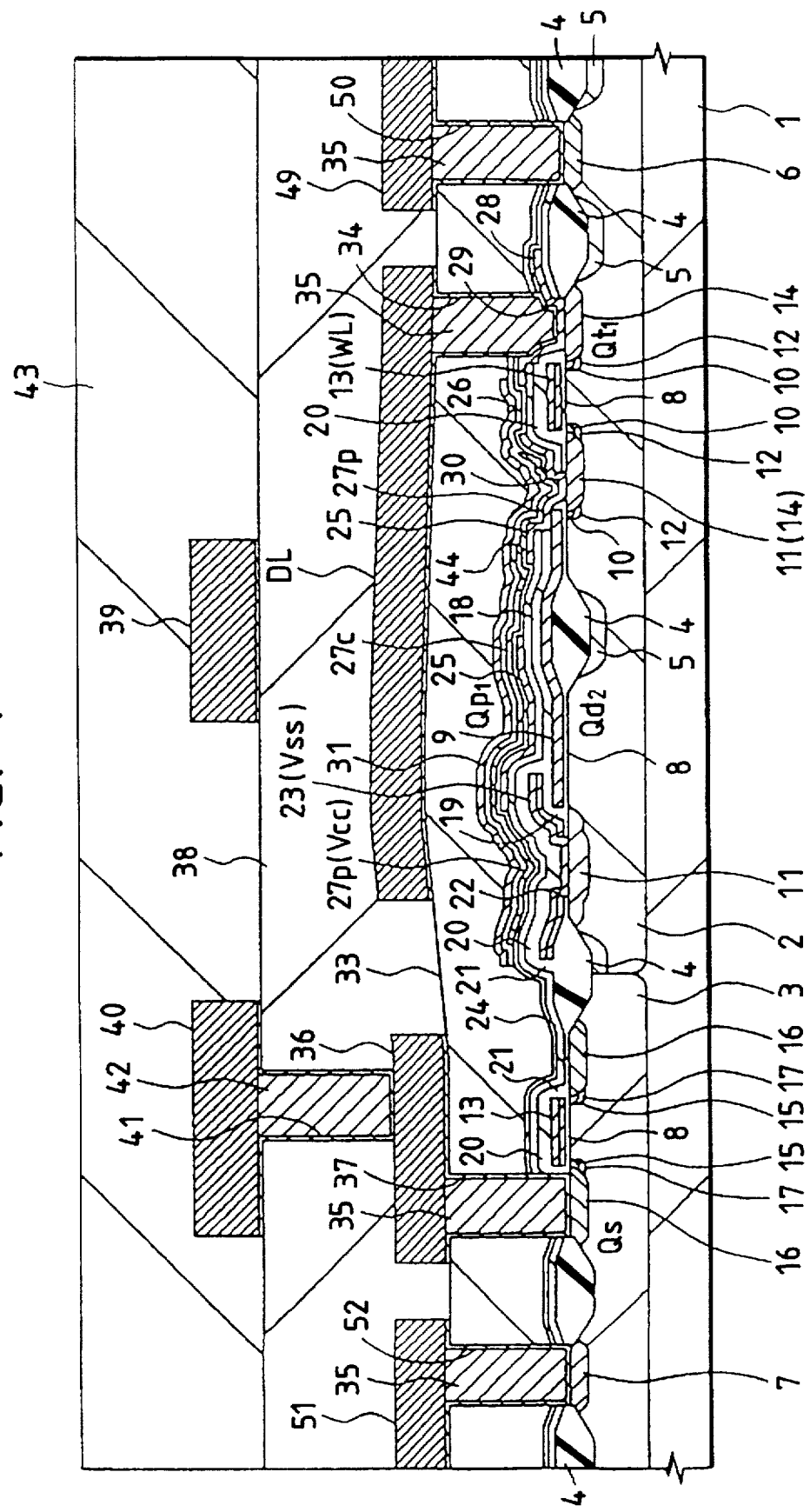
FIG. 1 is a sectional view of the principal part of a SRAM embodying the present invention.

A detailed description will subsequently be given of an embodiment of the present invention by reference to the accompanying drawings. In all the drawings for illustrating the embodiment of the present invention, like reference characters designate like component parts each having identical functions and the repetitive description thereof will be omitted.

Figure 2:
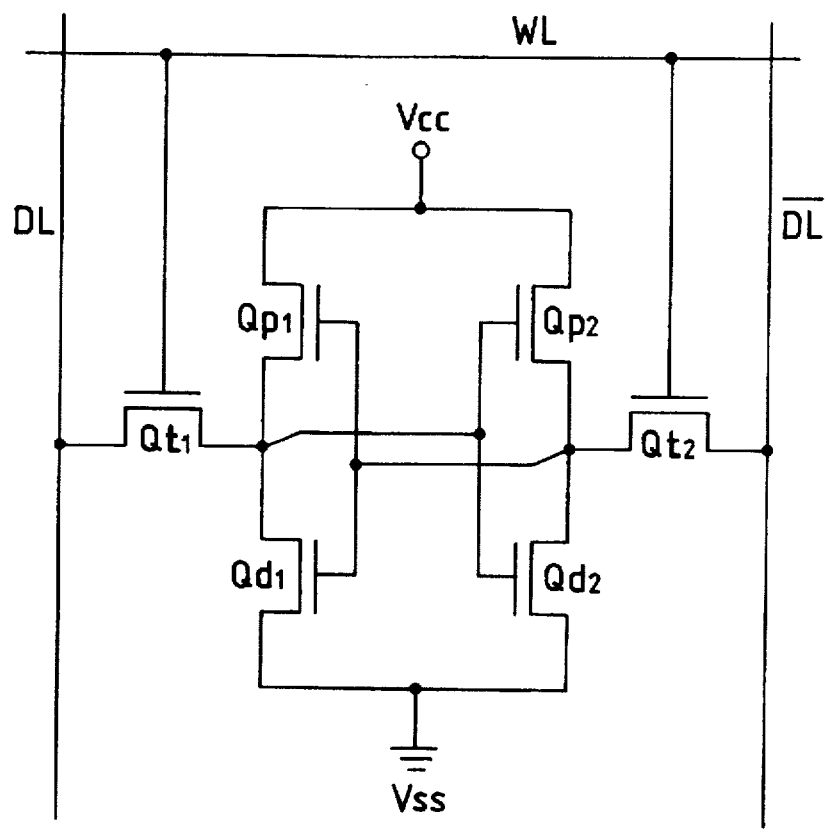
FIG. 2 is an equivalent circuit diagram of a memory cell of SRAM according to the present invention.

A SRAM (Static Random Access Memory) is taken up in this case as a kind of memory LSI embodying the present invention. As shown in FIG. 2, a memory cell of this SRAM comprises a pair of driving(driver) MISFETs Qd1, Qd2 each disposed at the intersections of a pair of complementary data lines (data lines DL, $\overline{DL}$) with a word line WL, a pair of loading(load)MISFETs Qp1, Qp2 and a pair of transfer MISFETs Qt1, Qt2. The driving MISFETs Qd1, Qd2 and the transfer MISFETs Qt1, Qt2 are of an n-channel type, whereas the loading MISFETs Qp1, Qp2 are of a p-channel type. In other words, this memory cell is of a complete CMOS type using four n-channel type MISFETs and two p-channel type MISFETs.

Of these six MISFETs constituting the memory cell, the pair of driving MISFETs Qd1, Qd2 and the pair of loading MISFETs Qp1, Qp2 constitute a flip-flop circuit as an information storage unit for storing 1-bit information. An input-output terminal on one side of the flip-flop circuit is connected to the source region of the transfer MISFET Qt1 and an input-output terminal on the other side thereof to the source region of the transfer MISFET Qt2.

The drain region of the transfer MISFET Qt1 is connected to the data line DL, whereas the drain region of the transfer MISFET Qt2 is connected to the data line $\overline{DL}$. Further, one end of the flip-flop circuit (the source regions of the loading MISFETs Qp1, Qp2) is connected to the supply voltage (Vcc) and the other end thereof (the source regions of the driving MISFETs Qd1, Qd2) to a reference voltage (Vss). The supply voltage (Vcc) is, for example, 3 V and the reference voltage (Vss) is, for example, 0 V (GND).

FIG. 1 is a sectional view of a memory cell of the above SRAM with part of a peripheral circuit adjacent thereto. Incidentally, there are mainly shown the driving MISFET Qd2, the transfer MISFET Qt1 and the loading MISFET Qp1 out of six MISFETs constituting the memory cell.

As shown in FIG. 1, for example, a p-type well 2 and an n-type well 3 are formed on a semiconductor substrate 1 made of $n^-$ type single crystal silicon. Field oxide films 4 for element separation are formed on the respective main surfaces of the p-type well 2 and the n-type well 3. Further, an inversion preventive p-channel stopper region 5 is formed beneath the field oxide film 4 of the p-type well 2.

The six MISFETs constituting the aforesaid memory cell are formed on the main surface of one active area of the p-type well 2. Moreover, a $p^+$ type semiconductor region 6 as a well feeding portion for supplying predetermined fixed potential to the p-type well 2 is formed in the other active area of the p-type well 2.

The peripheral circuit of the SRAM according to this embodiment of the invention has n- and p-channel type MISFETs forming a complementary MISFET and a p-channel type MISFET Qs forming part of the peripheral circuit is formed on the main surface of one active area of the n-type well 3. Further, an $n^+$ type semiconductor region 7 as a well feeding portion for supplying predetermined potential to the n-type well 3 is formed in the other active area of the n-type well 3.

The driving MISEFTs Qd1, Qd2 are each made up of gate oxide films 8, gate electrodes 9, the source and drain regions. The gate electrode 9 is formed of a first-layer polycrystal silicon film; n-type impurities (e.g., phosphorus) are introduced into the polycrystal silicon film to reduce its resistance value.

The source and drain regions of the driving MISFET Qd2 (Qd1) are made up of an $n^-$ type semiconductor region 10 of low impurity concentration and an $n^+$ type semiconductor region 11 of high impurity concentration. Further, a $p^+$ type semiconductor region 12 whose impurity concentration is higher than that of the p-type well 2 is formed in the p-type well 2 beneath the $n^-$ type semiconductor region 10. In other words, the source and drain regions of the driving MISFETs Qd1, Qd2 are LDD in structure and the $p^+$ type semiconductor region 12 is formed beneath the $n^-$ type semiconductor region 10. The bottom portion of the $p^{31}$ type semiconductor region 12 is made substantially equal in depth to that of the $n^+$ type semiconductor region 11 of high impurity concentration in order to prevent the punch-through.

The transfer MISFETs Qt1, Qt2 are each made up of the gate oxide films 8, gate electrodes 13, the source and drain regions. The gate electrode 13 is formed of a polycide stack film including a second-layer polycrystal silicon film and a high-melting-point metal film; n-type impurities (e.g., phosphorus) are introduced into the polycrystal silicon film to reduce its resistance value. The gate electrodes 13 of the transfer MISFETs Qt1, Qt2 are formed integrally with the word line WL.

The source and drain regions of the transfer MISFET Qt1 (Qt2) are made up of the $n^-$ type semiconductor region 10 of low impurity concentration and an $n^+$ type semiconductor region 14 of high impurity concentration. Further, the $p^+$ type semiconductor region 12 whose impurity concentration is higher than that of the p-type well 2 is formed in the p-type well 2 beneath the $n^-$ type semiconductor region 10. In other words, the source and drain regions of the transfer MISFETs Qd1, Qd2 are LDD in structure and the $p^+$ type semiconductor region 12 is formed beneath the $n^-$ type semiconductor region 10. The bottom portion of the $p^+$ type semiconductor region 12 is made substantially equal in depth to that of the $n^+$ type semiconductor region 14 of high impurity concentration in order to prevent the punch-through.

The p-channel type MISFET Qs forming part of the peripheral circuit is made up of the gate oxide film 8, the gate electrode 13 and the source and drain regions. The gate electrode 13, like the gate electrode 13 of the transfer MISFET Qt1 (Qt2), is formed of the second-layer polycrystal silicon film, and the source and drain regions are each made up of a $p^-$ type semiconductor region 15 of low impurity concentration and a $p^+$ type semiconductor region 16 of high impurity concentration. Further, an $n^+$ type semiconductor region 17 whose impurity concentration is higher than that of the p-type well 3 is formed in the p-type well 3 beneath the $p^-$ type semiconductor region 15. In other words, the source and drain regions of the p-channel type MISFET Qs are LDD in structure and the $n^+$ type semiconductor region 17 is formed beneath the $p^-$ type semiconductor region 15. The bottom portion of the $n^+$ type semiconductor region 17 is made substantially equal in depth to that of the $p^+$ type semiconductor region 16 of high impurity concentration in order to prevent the punch-through.

The gate electrode of an n-channel type MISFET (through not shown in FIG. 1) forming part of the peripheral circuit, like the gate electrode (13) of the transfer MISFET Qt1 (Qt2), is formed of the second-layer polycrystal silicon film, and the source and drain regions are each made up of the $n^-$ type semiconductor region (10) of low impurity concentration and the $n^+$ type semiconductor region (14) of high impurity concentration. Further, the $p^+$ type semiconductor region (12) whose impurity concentration is higher than that of the p-type well (2) is formed in the p-type well (2) beneath the $n^-$ type semiconductor region. In other words, the source and drain regions of the n-channel type MISFET, like those of the transfer MISFET, are, not exclusively, LDD in structure and the $p^+$ type semiconductor region (12) is formed beneath the $n^-$ type semiconductor region (10). The bottom portion of the $p^+$ type semiconductor region is made substantially equal in depth to that of the $n^+$ type semiconductor region of high impurity concentration in order to prevent the punch-through.

The SRAM according to this embodiment of the invention is made up of the driving MISFETs Qd1, Qd2 and the transfer MISFETs Qt1, Qt2 of the memory cell, the p-channel type MISFET Qs and the n-channel type MISFET which form part of the peripheral circuit, the source and drain regions of those in the peripheral circuit being LDD in structure. Further, the third semiconductor region is formed beneath the semiconductor region of low impurity concentration forming part of the source and drain regions, the third semiconductor region being different in conductivity type from the semiconductor region and higher in impurity concentration than the well. At this time, the bottom portion of the third semiconductor region is made substantially equal in depth to the semiconductor region of high impurity concentration forming part of the source and drain regions in order to prevent the punch-through.

With the arrangement above, it is possible to suppress not only the hot-carrier effect of the MISFET but also the punch-through. Moreover, the high-speed operation of the MISFET can be materialized since the parasitic capacitance formed between the third semiconductor region and the well by setting the bottom portion of the third semiconductor region equal in depth to that of the semiconductor region of high impurity concentration.

A silicon oxide film 18 is formed on the gate electrode 9 of the driving MISFET Qd2 (Qd1). Moreover, a sidewall spacer 19 formed of a silicon oxide film is formed on the sidewall of the gate electrode 9. A silicon oxide film 20 is formed on each of the gate electrodes 13 of the driving MISFETs Qd1, Qd2, the p-channel type MISFET Qs of the peripheral circuit (and the n-channel type MISFET). Further, a sidewall spacer 21 formed of a silicon oxide film is formed on the sidewall of each gate electrode 13.

A reference voltage line (Vss) 23 is connected through a connection hole 22 bored in a silicon oxide film situated in the same layer that contains the gate oxide film 8 to the source region ($n^+$ type semiconductor region 11) of the driving MISFET Qd2. The reference voltage line (Vss) 23 is formed of the second-layer polycrystal silicon film like the gate electrode (13) of the transfer MISFET Qt1 (Qt2). The silicon oxide film 20 is formed on the reference voltage line (Vss) 23, and the sidewall spacer 21 formed of the silicon oxide film is formed on the sidewall thereof.

The loading MISFETs Qp1, Qp2 of the memory cell are formed on the driving MISFETs Qd1, Qd2. The loading MISFET Qp1 (Qp2) is made up of a gate electrode 25 formed on a silicon oxide film 24, a silicon oxide film (gate oxide film) 26 formed on the gate electrode 25, a channel region 27c formed on the gate oxide film 26, a source and a drain region 27p, 27p. The gate electrode 25 of the loading MISFET Qp1, Qp2 is formed of a third-layer polycrystal silicon film. In this case, n-type impurities (e.g., P) are introduced into the polycrystal silicon film so as to reduce its resistance value.

The gate electrode 25 of the loading MISFET Qp1 is connected through a connection hole 30 bored in a silicon oxide film situated in the same layer that contains the silicon oxide films 24, 20 and the gate oxide film 8 to the gate electrode 9 of the driving MISFET Qd1 and the drain region (the $n^+$ type semiconductor region 11) of the driving MISFET Qd2. Likewise, the gate electrode 25 of the loading MISFET Qp2 is connected through the connection hole 30 bored in the silicon oxide film situated in the same layer that contains the silicon oxide films 24, 20 and the gate oxide film 8 to the gate electrode 9 of the driving MISFET Qd2 and the drain region (the $n^+$ type semiconductor region 11) of the driving MISFET Qd1.

A pad layer 28 is formed on the drain region ($n^+$ type semiconductor region 14) of the transfer MISFET Qt1, Qt2. The pad layer 28 is formed of the third-layer polycrystal silicon film situated in the same layer that contains the gate electrode 25 of the loading MISFET Qp1 (Qp2). One side of the pad layer 28 is connected through a connection hole 29 bored in the silicon oxide film situated in the same layer that contains the silicon oxide film 20 and the gate oxide film 8 to the drain region (the $n^+$ type semiconductor region 14) of the transfer MISFET Qt1, whereas the other side thereof is connected through the connection hole 29 bored in the silicon oxide film situated in the same layer that contains the silicon oxide films 20 and the gate oxide film 8 to the drain region (the $n^+$ type semiconductor region 14) of the transfer MISFET Qt2.

The channel region 27c, the source region 27p and the drain region 27p of the loading MISFETs Qp1 (Qp2) are formed of a fourth polycrystal silicon film. In order to make the threshold voltage of the loading MISFET Qp1 (Qp2) an enhancement type, n-type impurities (e.g., P) are introduced into the polycrystal silicon film of the channel region 27c. Moreover, p-type impurities (e.g., boron (B)) are introduced into the polycrystal silicon films of the source and drain regions 27p, 27p so as to reduce their resistance values.

The drain region 27p of the loading MISFET Qp1 is connected through a connection hole 44 bored in the silicon oxide film (gate oxide film) 26 to the gate electrode 25 of the loading MISFET Qp2 and further connected via the gate electrode 25 to the gate electrode 9 of the driving MISFET Qd2 and the drain region ($n^+$ type semiconductor region 11) of the driving MISFET Qd1. Likewise, the drain region 27p of the loading MISFET Qp2 is connected through the connection hole 44 bored in the silicon oxide film (gate oxide film) 26 to the gate electrode 25 of the loading MISFET Qp1 and further connected via the gate electrode 25 to the gate electrode 9 of the driving MISFET Qd1 and the drain region ($n^+$ type semiconductor region 11) of the driving MISFET Qd2.

The supply voltage line (Vcc) 27p is connected to the source region 27p of the loading MISFETs Qp1 (Qp2). The supply voltage line (Vcc) 27p is formed of the fourth-layer polycrystal silicon film situated in the same layer that contains the channel region 27c, the source region 27p and the drain region 27p of the loading MISFET Qp1 (Qp2) and also formed integrally with the source region 27p.

A plate electrode 32 is formed on the loading MISFETs Qp1 (Qp2) via a thin insulating film 31 which is a stack film including an silicon oxide film and a silicon nitride film. The plate electrode 32 is formed of a fifth-layer polycrystal silicon film and provided in such a way as to cover the whole area of the memory cell. N-type impurities (e.g., P) are introduced into the polycrystal silicon film.

A capacitance element in the SRAM according to this embodiment of the invention is formed between the loading MISFET Qp1 (Qp2) and the plate electrode 32 covering the former. The capacitance element is of stack (laminated) structure in that it uses the gate electrode 25 of the loading MISFET Qp1 (Qp2) as a first electrode, the plate electrode 32 as a second electrode, and the insulating film 31 between the gate electrode 25 and the plate electrode 32 as a dielectric, the supply voltage (Vcc) of the circuit being applied to the plate electrode 32 as the second electrode of the capacitance element.

The capacitance element is formed on the memory cell, and the charge of the capacitance element can be supplied via the gate electrode 25 (first electrode) of the loading MISFET Qp1 (Qp2) to the storage node (the input-output terminal of the flip-flop circuit) of the memory cell, whereby the α-ray soft error resistance of the memory cell can be improved.

The pair of complementary data lines (data lines DL, $\overline{DL}$) are formed on the plate electrode 32 via a BPSG (Boro Phospho Silicate Glass) film 33 (in FIG. 1, only the data line DL on one side is shown). The data line DL is connected to the pad layer 28 through a connection hole 34 bored in the BPSG film 33, the insulating film 31 and the silicon oxide film (gate oxide film) 26 and further connected via the pad layer 28 to the drain region ($n^+$ type semiconductor region 14) of the transfer MISFET Qt1. Likewise, the data line $\overline{DL}$ is connected to the pad layer 28 through the connection hole 34 bored in the BPSG film 33, the insulating film 31 and the silicon oxide film (gate oxide film) 26 and further connected via the pad layer 28 to the drain region ($n^+$ type semiconductor region 14) of the transfer MISFET Qt2. The complementary data lines (data lines DL, $\overline{DL}$) are made of the first-layer wiring material made up of a stack film including a titanium nitride (TiN) film and an aluminum (Al) film. Moreover, a tungsten (W) film 35 is embedded in the connection hole 34 for connecting the complementary data lines (data lines DL, $\overline{DL}$) and the pad layer 28.

Wiring 49 made of wiring material in the same first layer containing the complementary data lines (data lines DL, $\overline{DL}$) is provided on the other active area of the p-type well 2. The wiring 49 is connected to the $p^+$ type semiconductor region 6 (the feeding portion of the well) through a connection hole 50 bored in the BPSG film 33, the insulating film 31, the silicon oxide film (gate oxide film) 26 and the silicon oxide film 24. The tungsten (W) film 35 is embedded in the connection hole 50.

Wiring 36 made of wiring material in the same first layer containing the complementary data lines (data lines DL, $\overline{DL}$) is provided on the p-channel type MISFET Qs of the peripheral circuit. The wiring 36 is connected through a connection hole 37 to the $p^+$ type semiconductor region 16 on one side of the p-channel type MISFET Qs. The tungsten (W) film 35 is embedded in the connection hole 37.

Wiring 51 made of wiring material in the same first layer containing the complementary data lines (data lines DL, $\overline{DL}$) is provided on the other active area of the n-type well 3. The wiring 51 is connected to the $n^+$ type semiconductor region 7 (the feeding portion of the well) through a connection hole 52 bored in the BPSG film 33, the insulating film 31, the silicon oxide film (gate oxide film) 26 and the silicon oxide film 24. The tungsten (W) film 35 is embedded in the connection hole 52.

Wirings 39, 40 are formed above the complementary data lines (data lines DL, $\overline{DL}$) and the wirings 36, 49, 51 via a layer-to-layer insulating film 38. The wiring 39 formed in the upper portion constitutes, for example, a main word line. Further, the wiring 40 formed above the peripheral circuit is connected to the wiring 36 through a connection hole 41 bored in the layer-to-layer insulating film 38. The layer-to-layer insulating film 38 is formed of an insulating stack film including a silicon oxide film, a spin-on glass film and a silicon oxide film, whereas the wirings 39, 40 are formed of a stack film including a TiN film and an Al film. Moreover, a tungsten (W) film 42 is embedded in the connection hole 41 for connecting the wirings 40, 36.

A final passivation film 43 is formed on the wirings 39, 40. The final passivation film 43 is made up of, for example, a stack film including a silicon oxide film and a silicon nitride film.

Referring to FIGS. 3–23, there will subsequently be given a description of a process for producing the SRAM thus configured.

As shown in FIG. 3, first, the semiconductor substrate 1 made of $n^-$ type single crystal silicon is prepared and the p-type well 2 is formed by injecting ions of p-type impurities (e.g., boron (B)) into the semiconductor substrate 1 in the memory-cell forming area and simultaneously the p-type well 3 is formed by injecting ions of n-type impurities (e.g., phosphorus (P)) into the semiconductor substrate 1 in the p-channel type MISFET forming area of the peripheral circuit.

Subsequently, as shown in FIG. 4, the field oxide films 4 for element separation are formed on the respective main surfaces of p-type well 2 and the n-type well 3 by the thermal oxidation method (LOCOS method) using the silicon nitride film as an oxidation resistance mask and the p-type channel stopper region 5 is formed beneath each field oxide film 4 of the p-type well 2. Then the surface of the semiconductor substrate 1 is subjected to thermal oxidation to form the gate oxide films 8 on the respective surfaces of the active areas of the p-type and n-type wells 2, 3 surrounded by the field oxide films 4, respectively.

Subsequently, as shown in FIG. 5, the gate electrode 9 of the driving MISFET Qd2 (Qd1) is formed on the main surface of the p-type well 2. The gate electrode 9 is formed by stacking the polycrystal silicon film and the silicon oxide film 18 on the semiconductor substrate 1 by the CVD (Chemical Vapor Deposition) method and patterning these films by etching with the photoresist as a mask. The silicon oxide film 18 is used as a protective film for electrically separating the gate electrode 9 from the conductive layer formed thereon.

Subsequently, as shown in FIG. 6, the sidewall spacer 19 is formed on the sidewall of the gate electrode 9 of the driving MISFET Qd2 (Qd1). The sidewall spacer 19 is formed by, for example, RIE (Reactive Ion Etching), that is, anisotropically etching the silicon oxide film built up on the semiconductor substrate 1 through the CVD method. Subsequently, ions of n-type impurities (e.g., (P)) are implanted into the p-type well 2 on both sides of the gate electrode 9 to form the $n^+$ type semiconductor region 11 constituting part of the source and drain regions of the driving MISFET Qd2 (Qd1).

Figure 7:
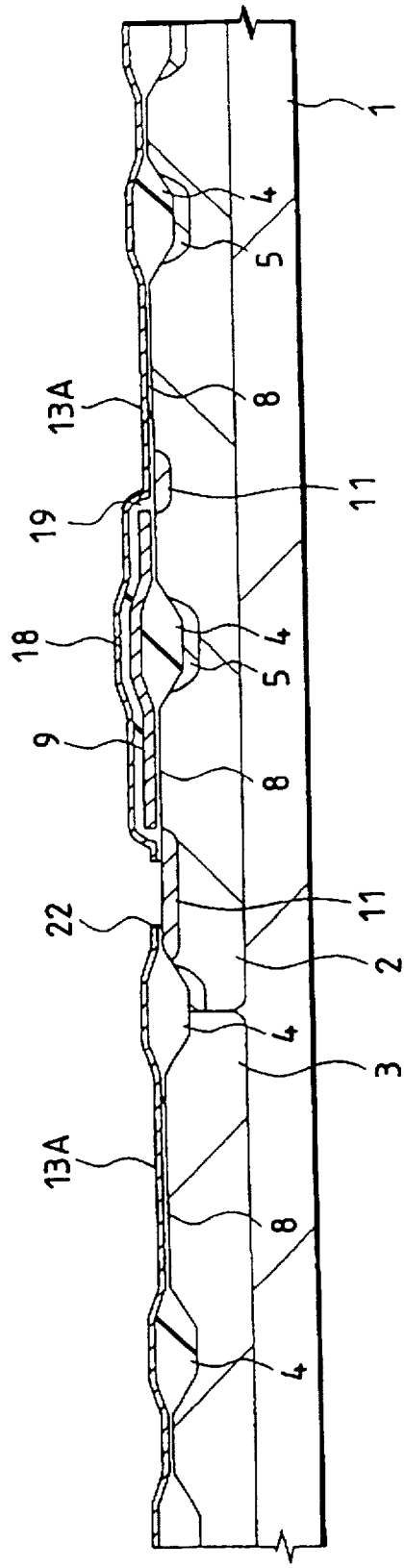
FIG. 7 is a sectional view of the principal part illustrative of the process for producing the SRAM according to the present invention.

Subsequently, as shown in FIG. 7, a polycrystal silicon film 13A is stacked through the CVD method on the semiconductor substrate 1 so as to bore the connection hole 22 reaching the source region ($n^+$ type semiconductor region 11) of the driving MISFET Qd2 (Qd1) by etching the polycrystal silicon film 13A and the silicon oxide film (the silicon oxide film situated in the same layer that contains the gate oxide film 8) beneath the polycrystal silicon film 13A.

Figure 8:
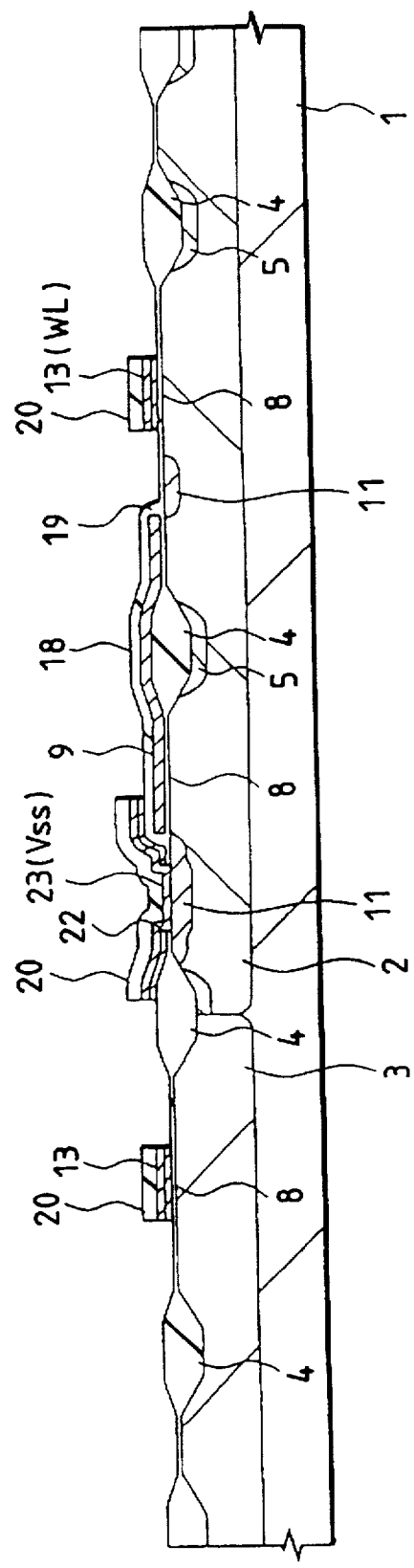
FIG. 8 is a sectional view of the principal part illustrative of the process for producing the SRAM according to the present invention.

Subsequently, as shown in FIG. 8, the gate electrode 13 (word line WL) of the transfer MISFET Qt1 (Qt2) and the reference voltage line (Vss) 23 are formed on the main surface of the p-type well 2, and the gate electrode 13 of the p-channel type MISFET Qs is formed on the main surface of the n-type well 3. The gate electrode 13 (word line WL) and the reference voltage line (Vss) 23 is formed by successively stacking the polycrystal silicon film, a tungsten silicide (WSi2) and the silicon oxide film 20 on the polycrystal silicon film 13A through the CVD and sputtering methods, and patterning these films by etching with the photoresist as a mask. The reference voltage line (Vss) 23 is connected through the connection hole 22 to the source region ($n^+$ type semiconductor region 11) of the driving MISFET Qd2 (Qd1).

Figure 9:
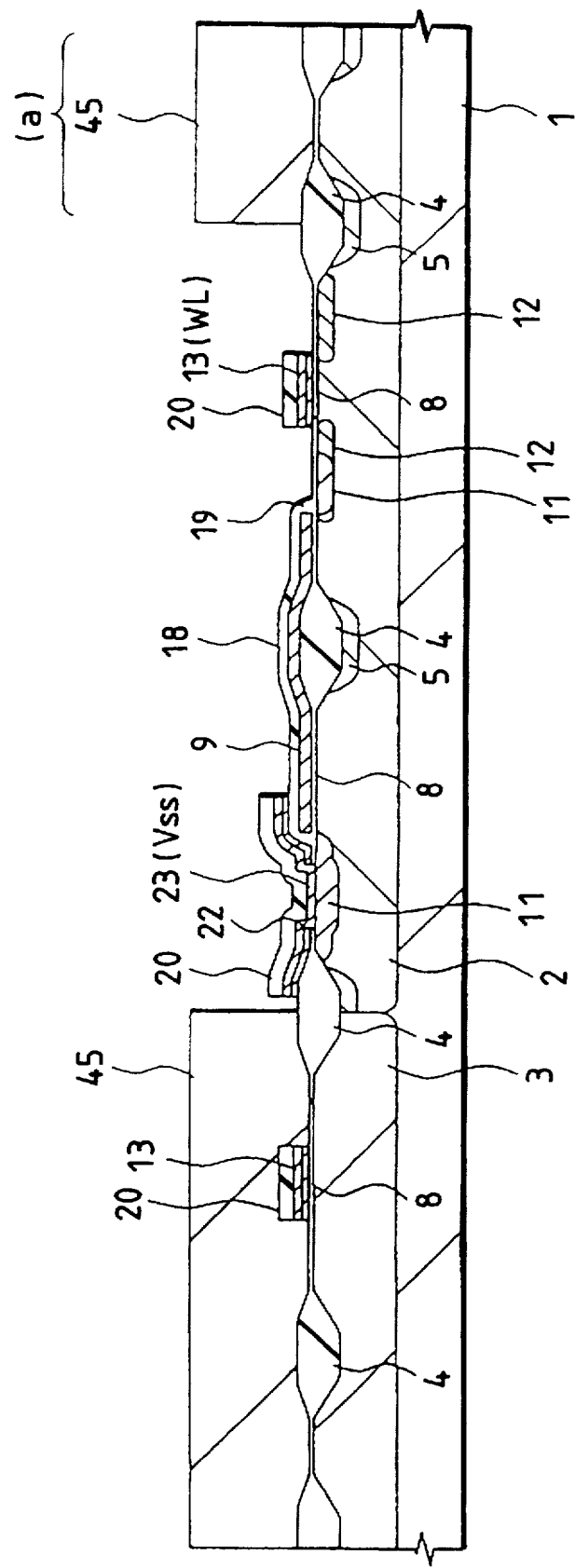
FIG. 9 is a sectional view of the principal part illustrative of the process for producing the SRAM according to the present invention.
Figure 10:
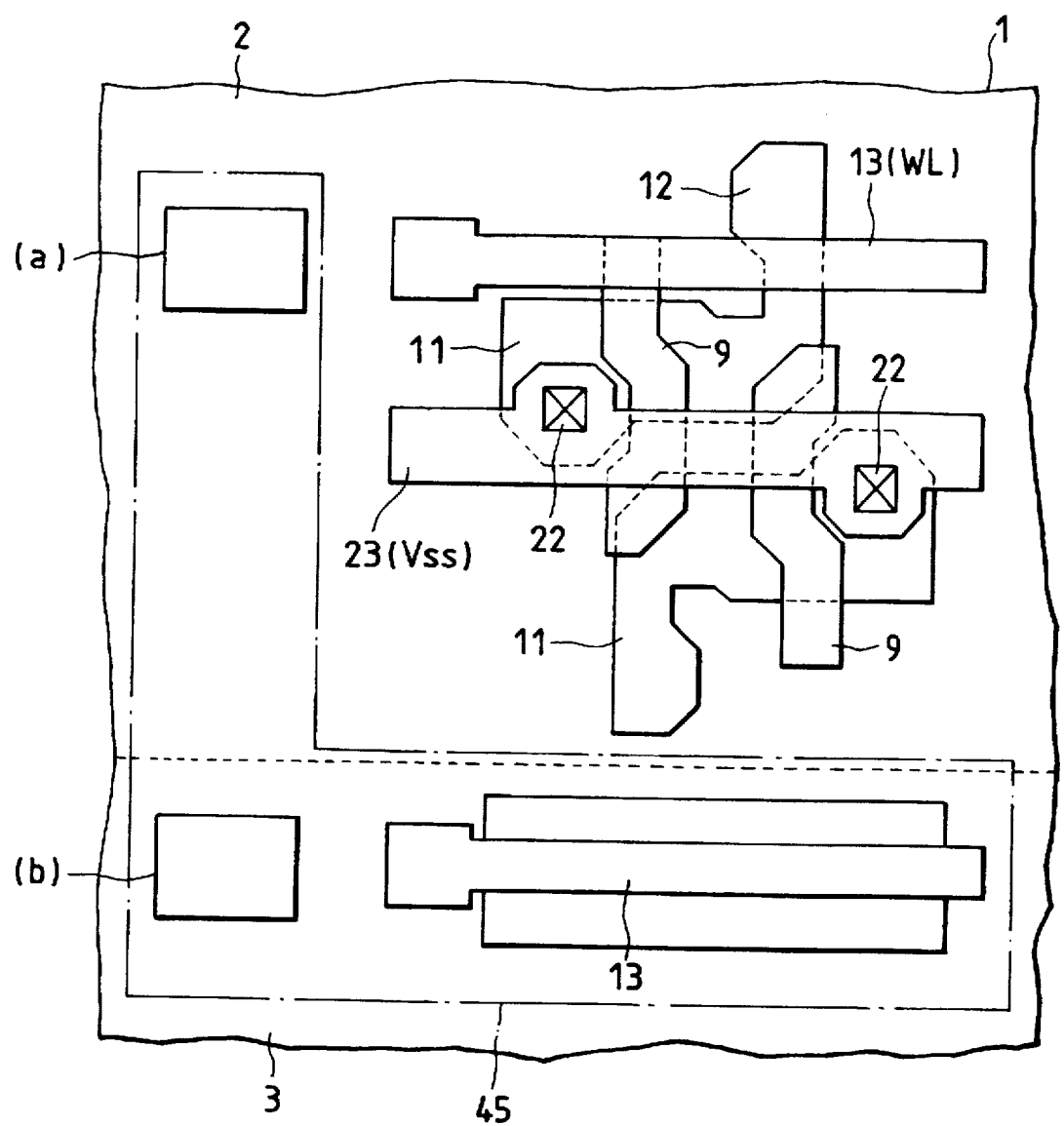
FIG. 10 is a plan view of the principal part illustrative of the process for producing the SRAM according to the present invention.

Subsequently, as shown in FIGS. 9, 10, ions of p-type impurities (B) are implanted into the p-type well 2 with the photoresist 45 formed on the n-type well 3 as a mask to form the $p^+$ type semiconductor region 12 in the p-type well 2 on both sides of the gate electrode 9 of the driving MISFET Qd2 (Qd1) and the gate electrode 13 (word line WL) of the transfer MISFET Qt1 (Qt2). At this time according to this embodiment of the invention, the photoresist 45 is also formed on the surface (a) of the p-type well 2 in the area where the feeding portion of the well ($p^+$ type semiconductor region 6) is formed as shown in FIGS. 9, 10, so that the p-type impurities are prevented from being implanted in this area.

Figure 11:
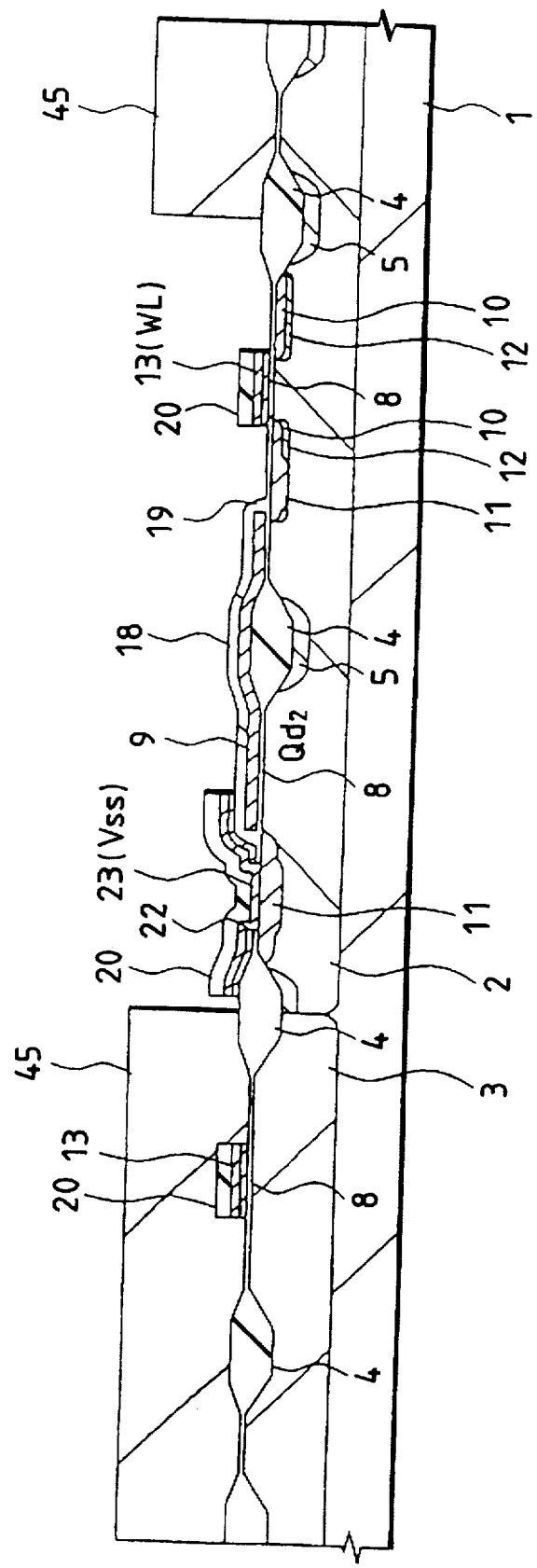
FIG. 11 is a sectional view of the principal part illustrative of the process for producing the SRAM according to the present invention.

Subsequently, as shown in FIG. 11, ions of n-type impurities (e.g., phosphorus (P)) are implanted into the p-type well 2 with the photoresist 45 covering the respective surfaces of the feeding-portion forming area of the p-type well 2 and the n-type well 3 as a mask so as to form the n⁻ type semiconductor region 10 as part of the source and drain regions of each of the driving MISFET Qd2 (Qd1) and the transfer MISFET Qt1 (Qt2).

Figure 12:
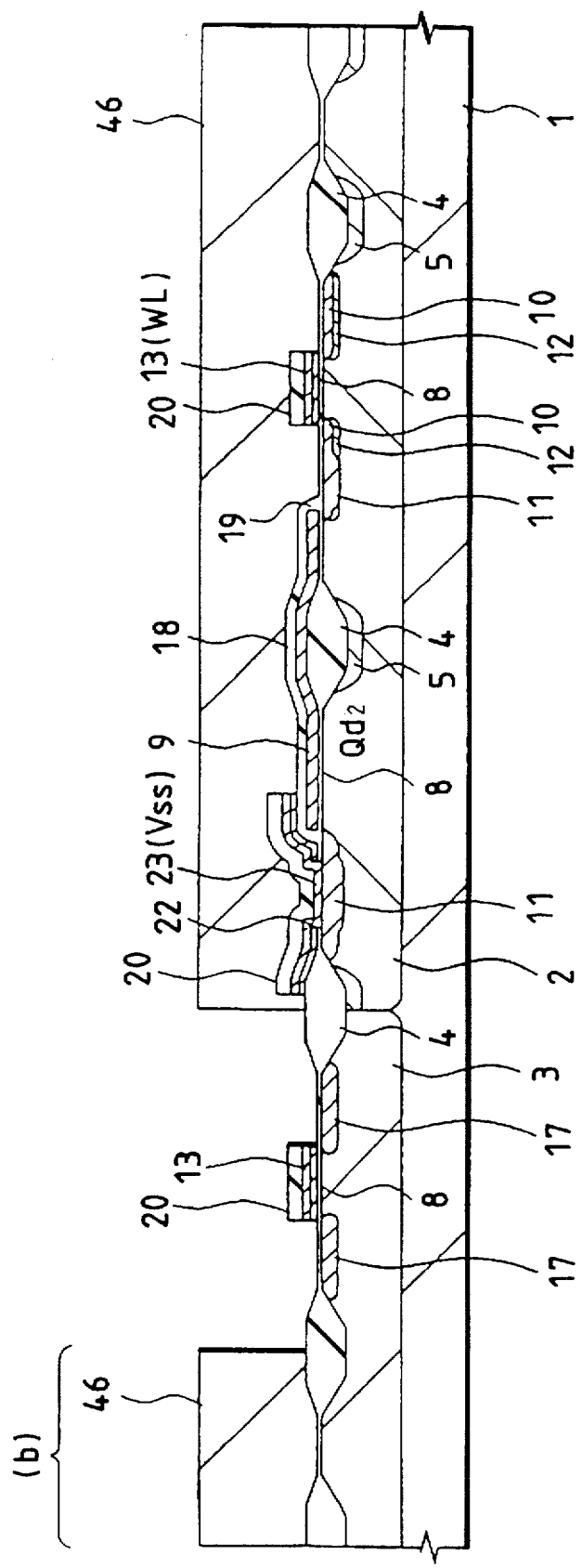
FIG. 12 is a sectional view of the principal part illustrative of the process for producing the SRAM according to the present invention.
Figure 13:
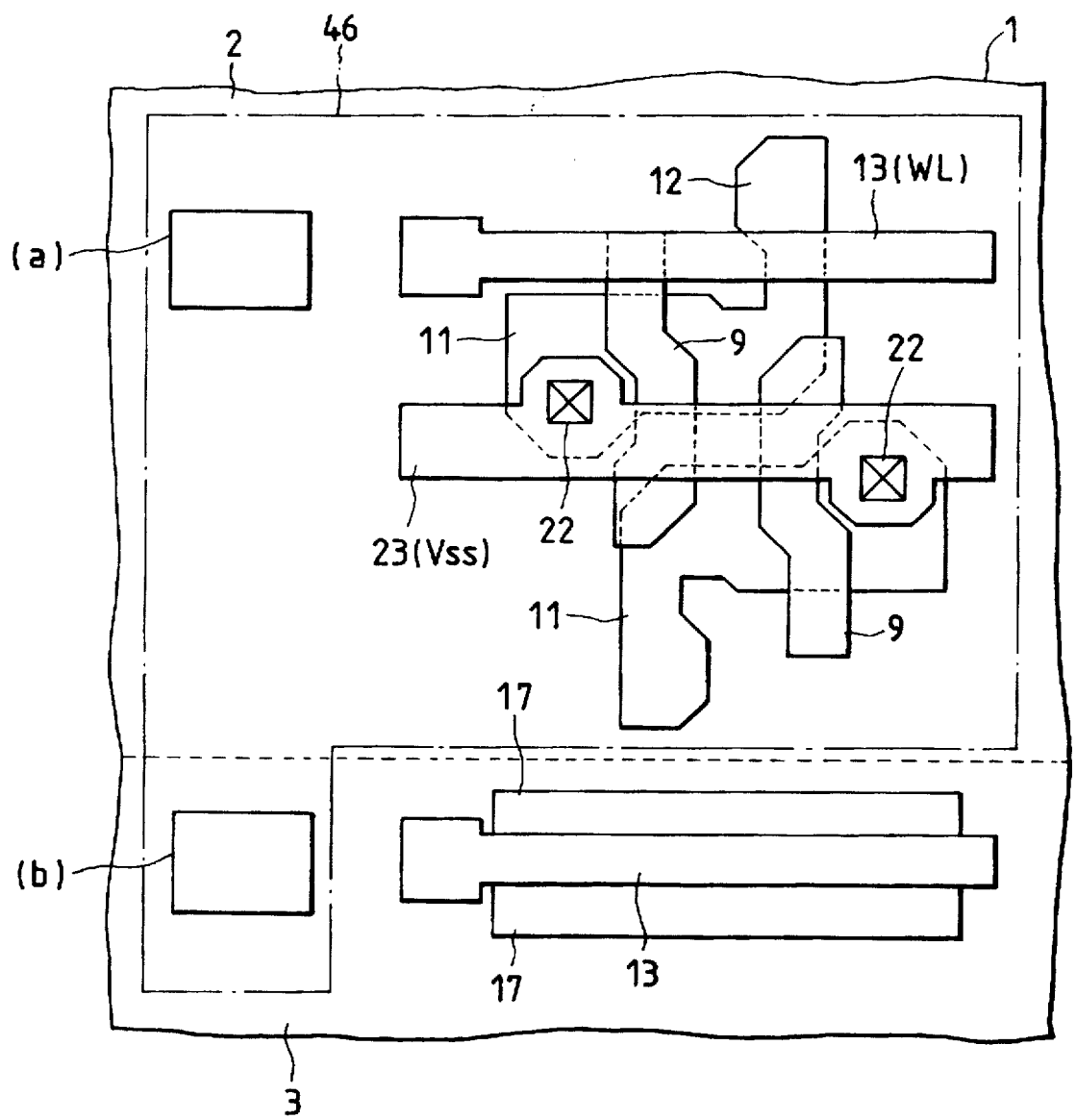
FIG. 13 is a plan view of the principal part illustrative of the process for producing the SRAM according to the present invention.

Subsequently, as shown in FIGS. 12, 13, ions of n-type impurities (e.g., phosphorus (P)) are implanted into the n-type well 3 with the photoresist 46 formed on the p-type well 2 as a mask after the photoresist 45 is removed so as to form the n⁺ type semiconductor region 17 in the n-type well 3 on both sides of the gate electrode 13 of the p-channel type MISFET Qs. At this time according to this embodiment of the invention, the photoresist 46 is also formed on the surface (b) of the n-type well 3 in the area where the feeding portion of the well (p⁺ type semiconductor region 7) is formed as shown in FIGS. 12, 13, so that the n-type impurities are prevented from being implanted in this area.

Figure 14:
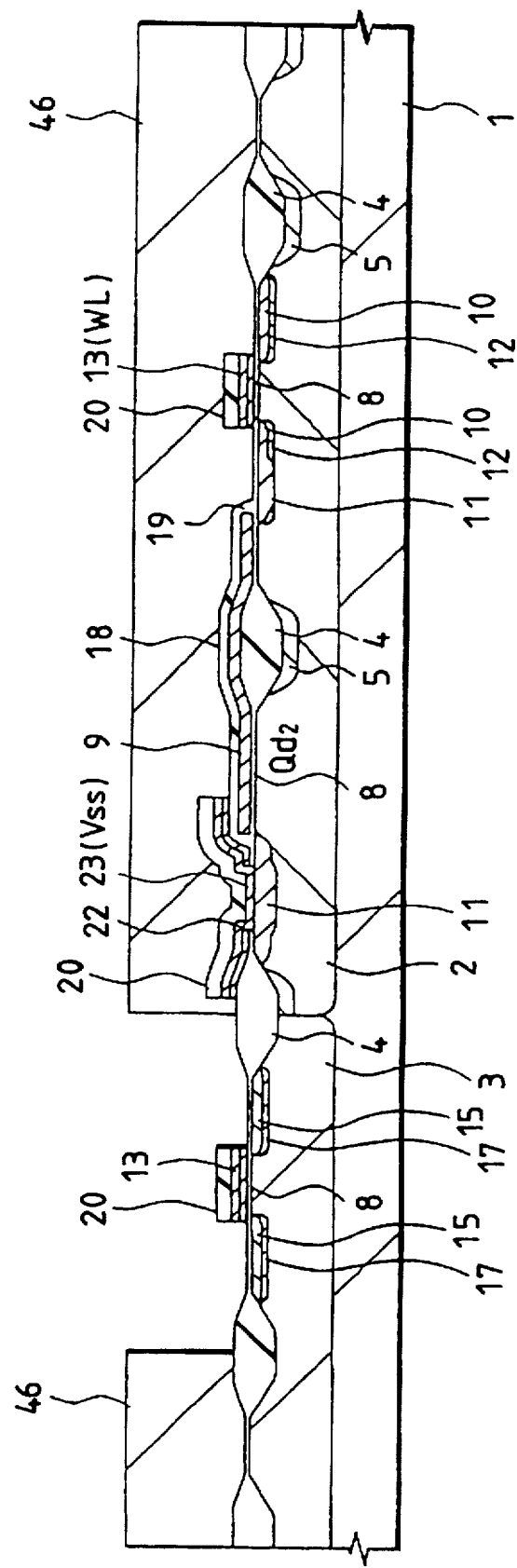
FIG. 14 is a sectional view of the principal part illustrative of the process for producing the SRAM according to the present invention.

Subsequently, as shown in FIG. 14, ions of p-type impurities (e.g., boron (B)) are implanted into the n-type well 3 with the photoresist 46 covering the respective surfaces of the feeding-portion forming area of the n-type well 3 and the p-type well 2 as a mask so as to form the p⁻ type semiconductor region 15 as part of the source and drain regions of the p-channel type MISFET Qs.

Figure 15:
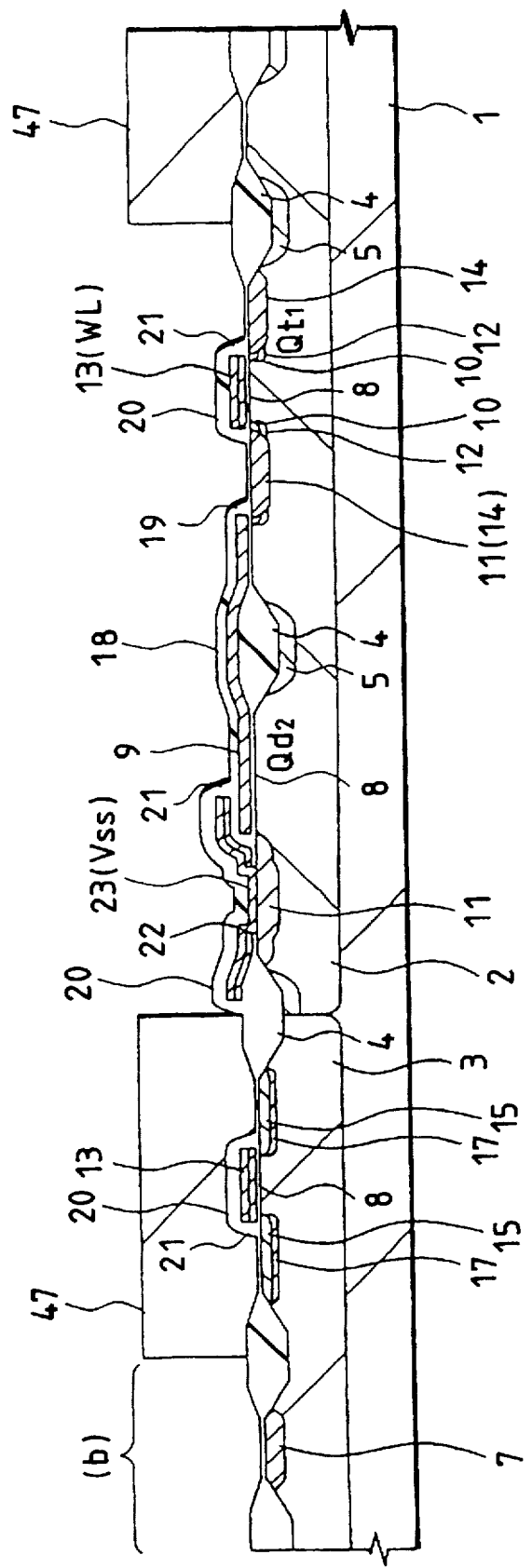
FIG. 15 is a sectional view of the principal part illustrative of the process for producing the SRAM according to the present invention.

Subsequently, as shown in FIG. 15, ions of n-type impurities (e.g., phosphorus (P)) are implanted into the p- and n-type wells 2, 3 with the photoresist 47 formed on the respective surfaces of the feeding-portion forming area of the p-type well 2 and the p-channel type MISFET forming area of the n-type well 3 as a mask after the photoresist 46 is removed so as to form the n⁺ type semiconductor region 14 and the n⁺ type semiconductor region 7 as part of the source and drain regions of the transfer MISFET Qt1 (Qt2). The photoresist 47 has, as shown in FIG. 15, an opening in the surface (b) of the n-type well 3 in the area where the feeding portion of the well (n⁺ type semiconductor region 7) is formed.

Figure 16:
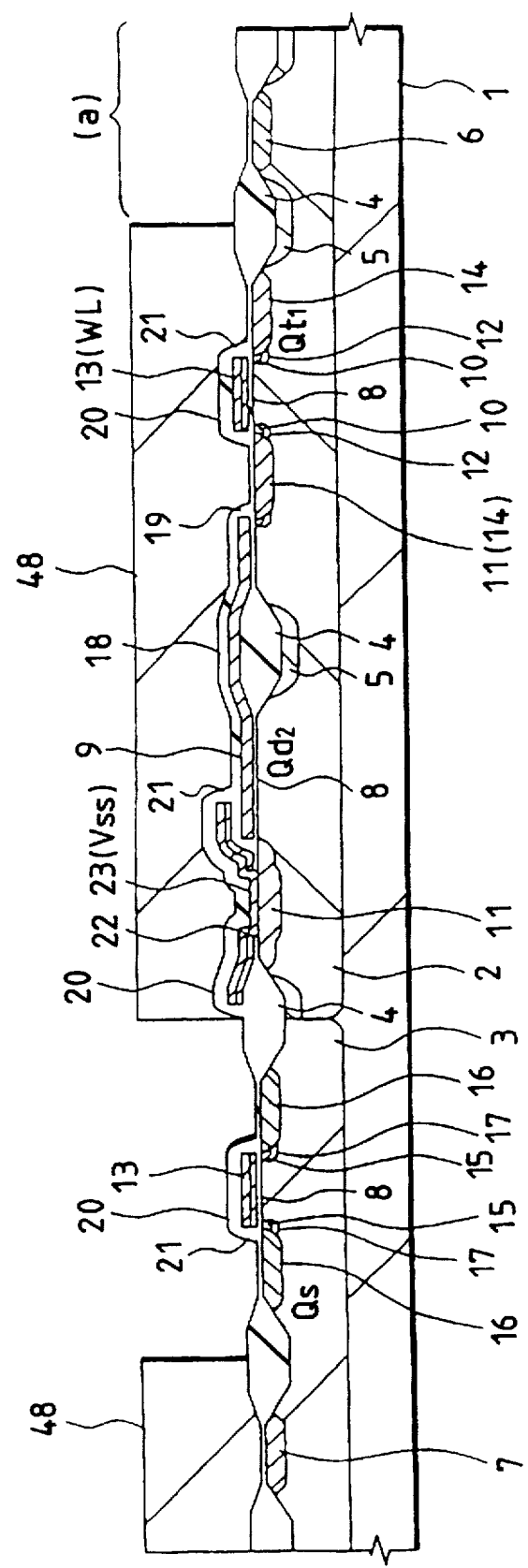
FIG. 16 is a sectional view of the principal part illustrative of the process for producing the SRAM according to the present invention.

Subsequently, as shown in FIG. 16, ions of p-type impurities (e.g., boron (B)) are implanted into the p- and n-type wells 2, 3 with the photoresist 48 formed on the respective surfaces of the n⁺ type semiconductor region 7 (feeding portion of the well) of the n-type well 3 and each of the driving MISFET Qd2 (Qd1) and transfer MISFET Qt1 (Qt2) of the p-type well 2 as a mask after the photoresist 47 is removed so as to form the p⁺ type semiconductor region 16 and the p⁺ type semiconductor region 6 (feeding portion of the well) as part of the source and drain regions of the p-channel type MISFET Qs. The photoresist 48 has, as shown in FIG. 16, an opening in the surface (a) of the p-type well 2 in the area where the feeding portion of the well (p⁺ type semiconductor region 6) is formed.

Figure 17:
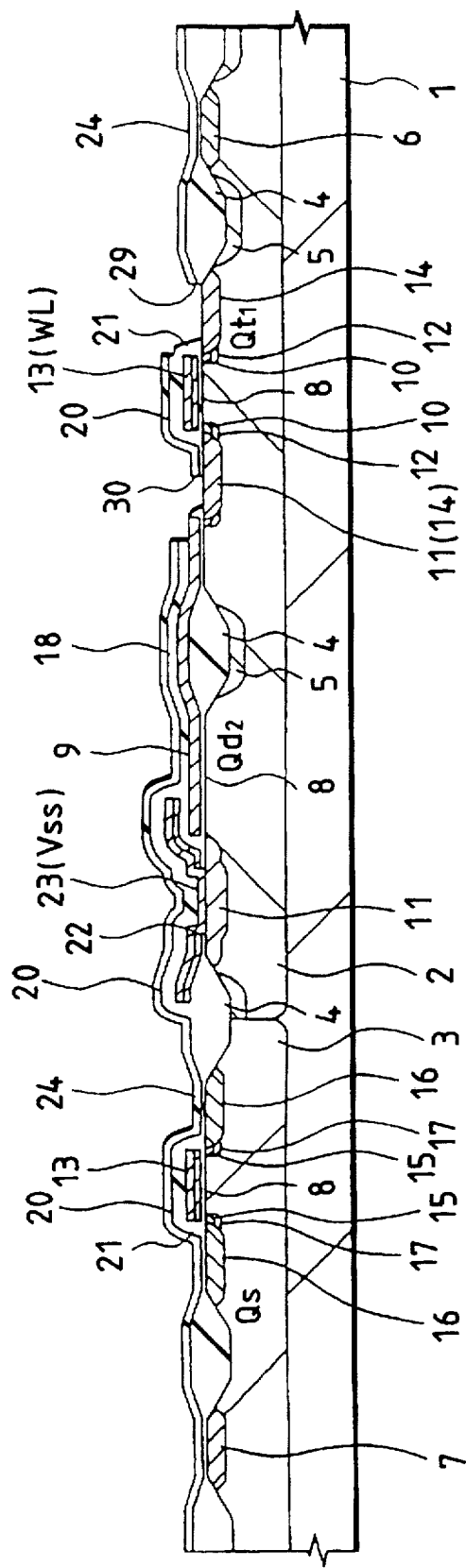
FIG. 17 is a sectional view of the principal part illustrative of the process for producing the SRAM according to the present invention.

Subsequently, as shown in FIG. 17, the silicon oxide film 24 is stacked on the semiconductor substrate 1 through the CVD method after the photoresist 48 is removed. Then the silicon oxide film 24 and the silicon oxide film 18 together with the silicon oxide film (situated in the same layer containing the gate oxide film 8) beneath the silicon oxide film 24 are etched to bore the connection hole 30 reaching the gate electrode 9 of the driving MISFET Qd2 (Qd1) and the drain region (n⁺ type semiconductor region 11) of the driving MISFET Qd2 (Qd1) and the connection hole 29 reaching the drain region (n⁺ type semiconductor region 14) of the transfer MISFET Qt1 (Qt2).

Figure 18:
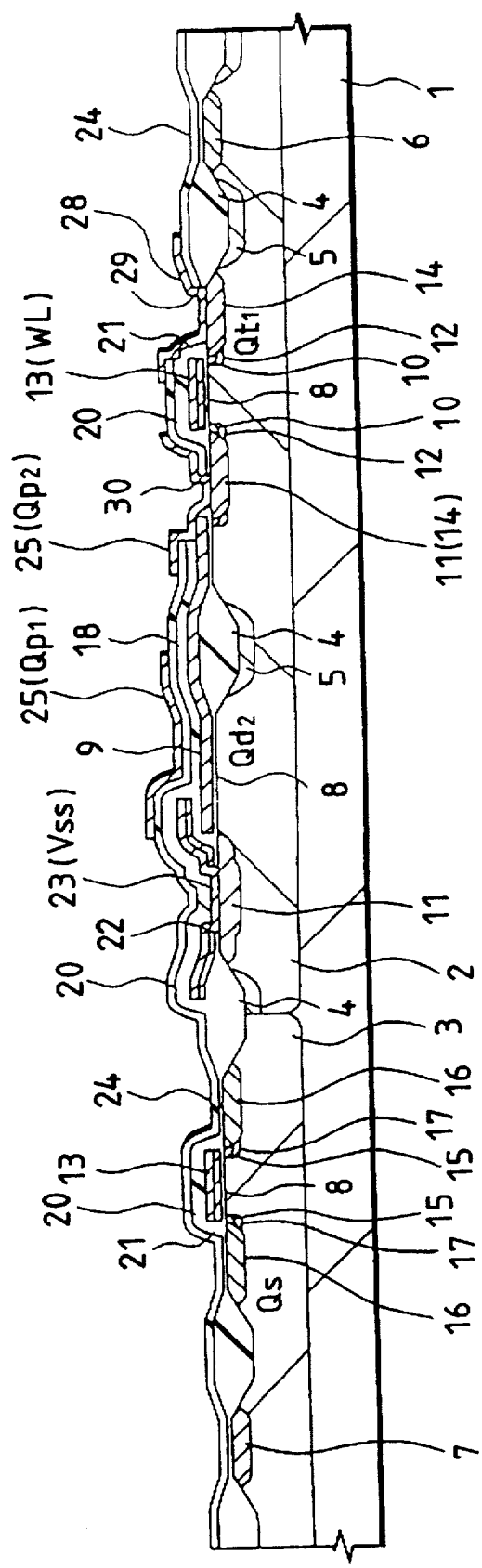
FIG. 18 is a sectional view of the principal part illustrative of the process for producing the SRAM according to the present invention.

Subsequently, as shown in FIG. 18, the gate electrode 25 and the pad layer 28 of the loading MISFET Qp1 (Qp2) are formed by patterning the polycrystal silicon film stacked on the semiconductor substrate 1 through the CVD method. The gate electrode 25 of the loading MISFET Qp1 is connected through the connection hole 30 to the gate electrode 9 of the driving MISFET Qd1 and to the drain region (n⁺ type semiconductor region 11) of the driving MISFET Qd2, whereas the gate electrode 25 of the loading MISFET Qp2 is connected through the connection hole 30 to the gate electrode 9 of the driving MISFET Qd2 and to the drain region (n⁺ type semiconductor region 11) of the driving MISFET Qd1. The pad layer 28 is connected through the connection hole 29 to the drain regions (n⁺ type semiconductor region 14) of the transfer MISFETs Qt1, Qt2.

Figure 19:
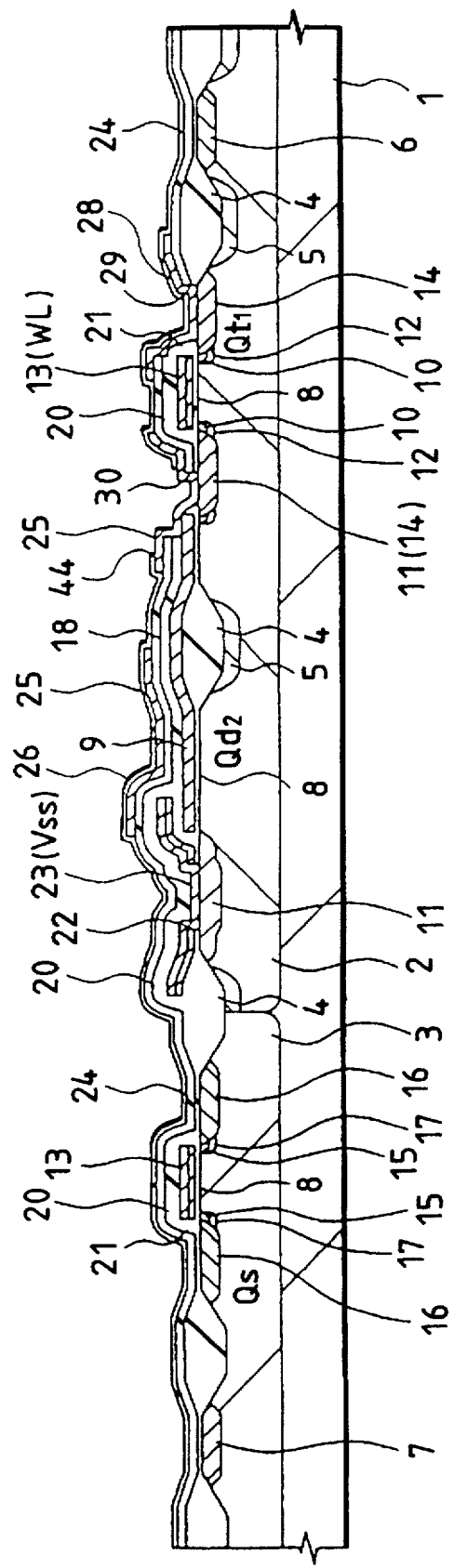
FIG. 19 is a sectional view of the principal part illustrative of the process for producing the SRAM according to the present invention.

Subsequently, as shown in FIG. 19, the silicon oxide film 26 as the gate oxide film of the loading MISFET Qp1 (Qp2) is stacked on the semiconductor substrate 1 through the CVD method and then the connection hole 44 is bored by etching the silicon oxide film 26 on the gate electrode 25 of the driving MISFET Qd2 (Qd1).

Figure 20:
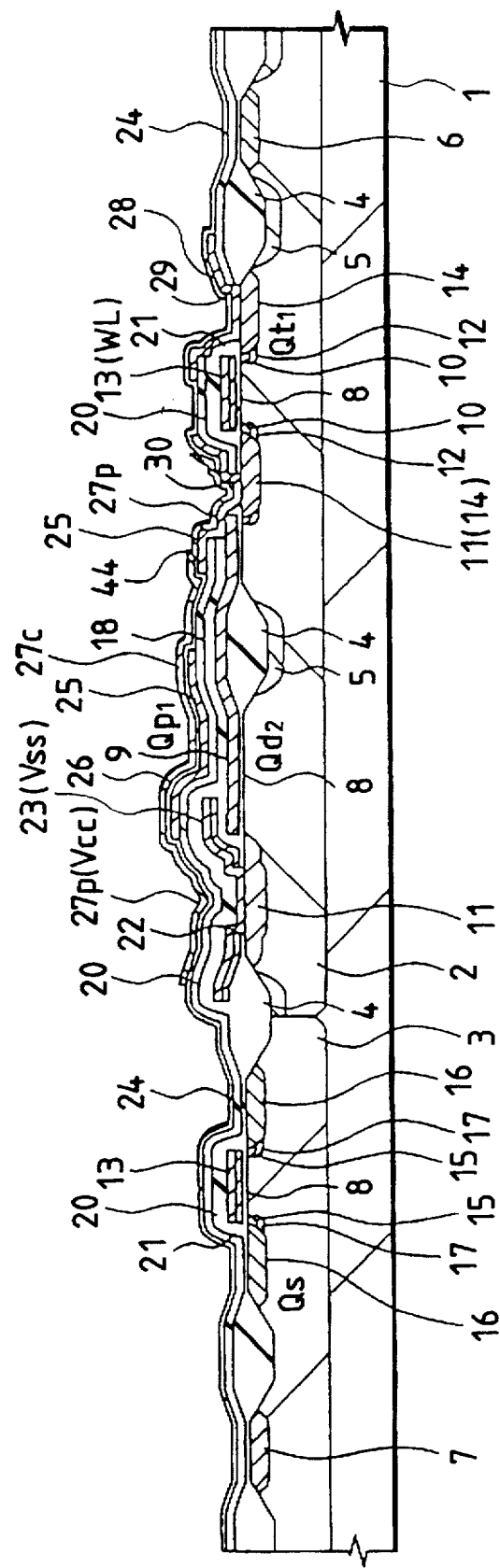
FIG. 20 is a sectional view of the principal part illustrative of the process for producing the SRAM according to the present invention.

Subsequently, as shown in FIG. 20, ions of p-type impurities (e.g., boron (B)) are implanted into part of the polycrystal silicon film stacked on the silicon oxide film (gate oxide film) 26, whereas ions of n-type impurities (e.g., phosphorus (P)) are implanted into the other part thereof. Then the channel region 27c, the source region 27p and the drain region 27p of the loading MISFET Qp1 (Qp2) and the supply voltage line (Vcc) 27p are formed by patterning the polycrystal silicon film. The drain region 27p of the loading MISFET Qp1 is connected through the connection hole 44 to the gate electrode 25 of the loading MISFET Qp2, whereas the drain region 27p of the loading MISFET Qp2 is connected through the connection hole 44 to the gate electrode 25 of the loading MISFET Qp1.

Figure 21:
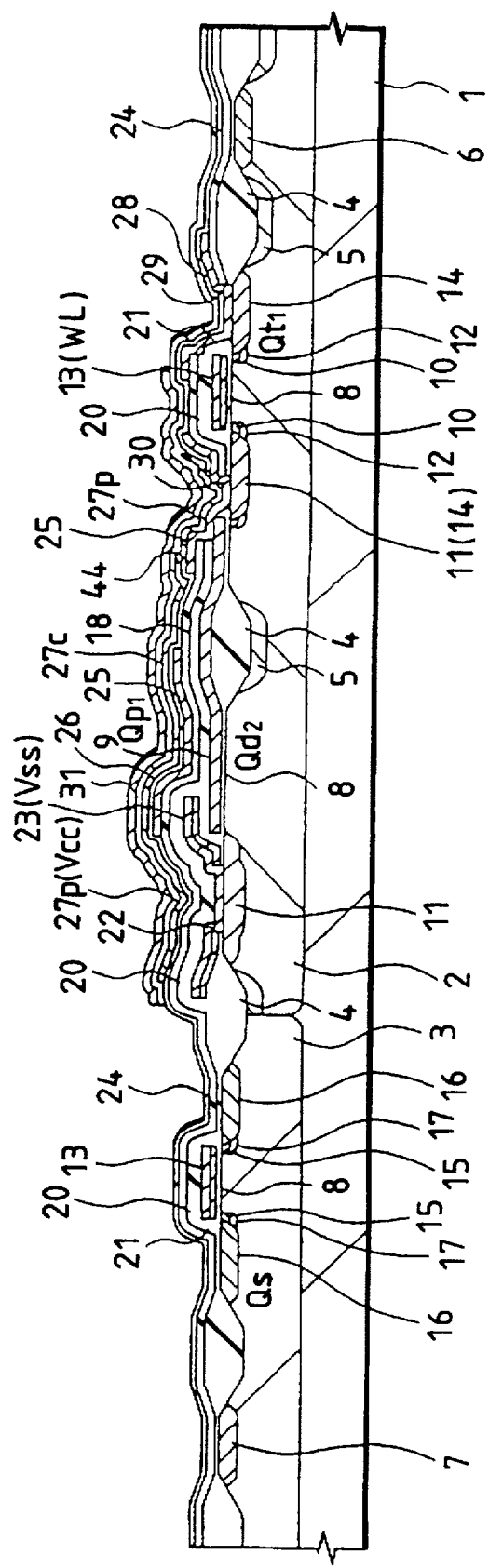
FIG. 21 is a sectional view of the principal part illustrative of the process for producing the SRAM according to the present invention.

Subsequently, as shown in FIG. 21, the insulating film 31 which is a stack film including the silicon oxide film and the silicon nitride film is stacked on the semiconductor substrate 1 through the CVD method and then the plate electrode 32 covering substantially the whole area of the memory cell is formed by patterning the polycrystal silicon film stacked on the insulating film 31 through the CVD method.

Figure 22:
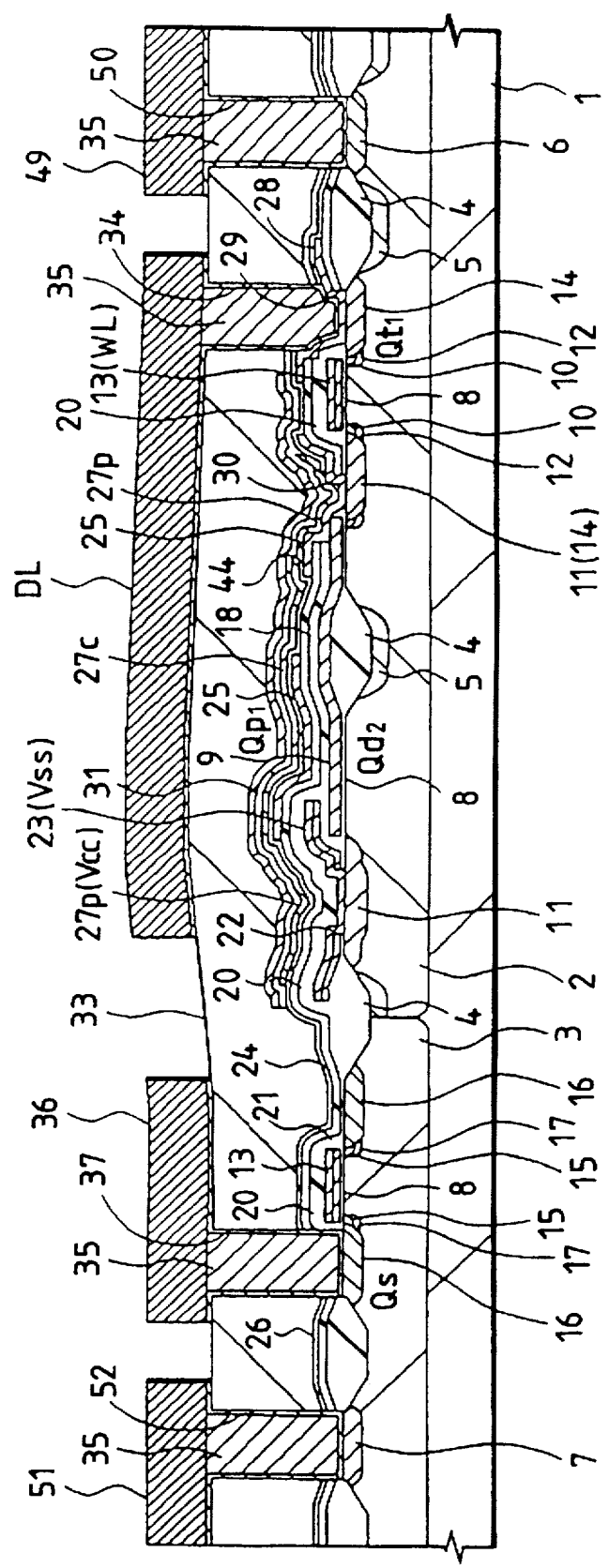
FIG. 22 is a sectional view of the principal part illustrative of the process for producing the SRAM according to the present invention.

Subsequently, as shown in FIG. 22, the BPSG film 33 is stacked on the semiconductor substrate 1 through the CVD method and the surface of the BPSG film 33 is flattened by heat-treating the semiconductor substrate 1. Then the connection holes 34, 37, 50, 52 are bored by etching the BPSG film 33, the insulating film 31 and the silicon oxide film (gate oxide film) 26. Further, the complementary data lines (data lines DL, $\overline{DL}$) and the wiring 36, 49, 51 are formed by patterning the first-layer wiring material stacked on the BPSG film 33 by sputtering. The complementary data lines (data lines DL, $\overline{DL}$) are connected through the connection hole 34 to the pad layer 28 and the wiring 36 is connected through the connection hole 37 to the one (p⁺ type semiconductor region 16) of the source and drain regions of the p-channel type MISFET Qs. The wiring 49 is connected through the connection hole 50 to the p⁺ type semiconductor region 6 (the feeding portion of the well) and the wiring 51 is connected through the connection hole 52 to the n⁺ type semiconductor region 7 (the feeding portion of the well). In order to form the complementary data lines (data lines DL, $\overline{DL}$) and the wiring 36, 49, 51, the TiN film is stacked by sputtering on the BPSG film 33 including the interiors of the connection holes 34, 37, 50, 52 and then the W film 35 is stacked through the CVD film. Further, the W film 35 in an area excluding the interiors of the connection holes 34, 37, 50, 52 is removed by etching back the W film 35 and the Al film is stacked by sputtering so as to pattern the Al film and the TiN film.

Figure 23:
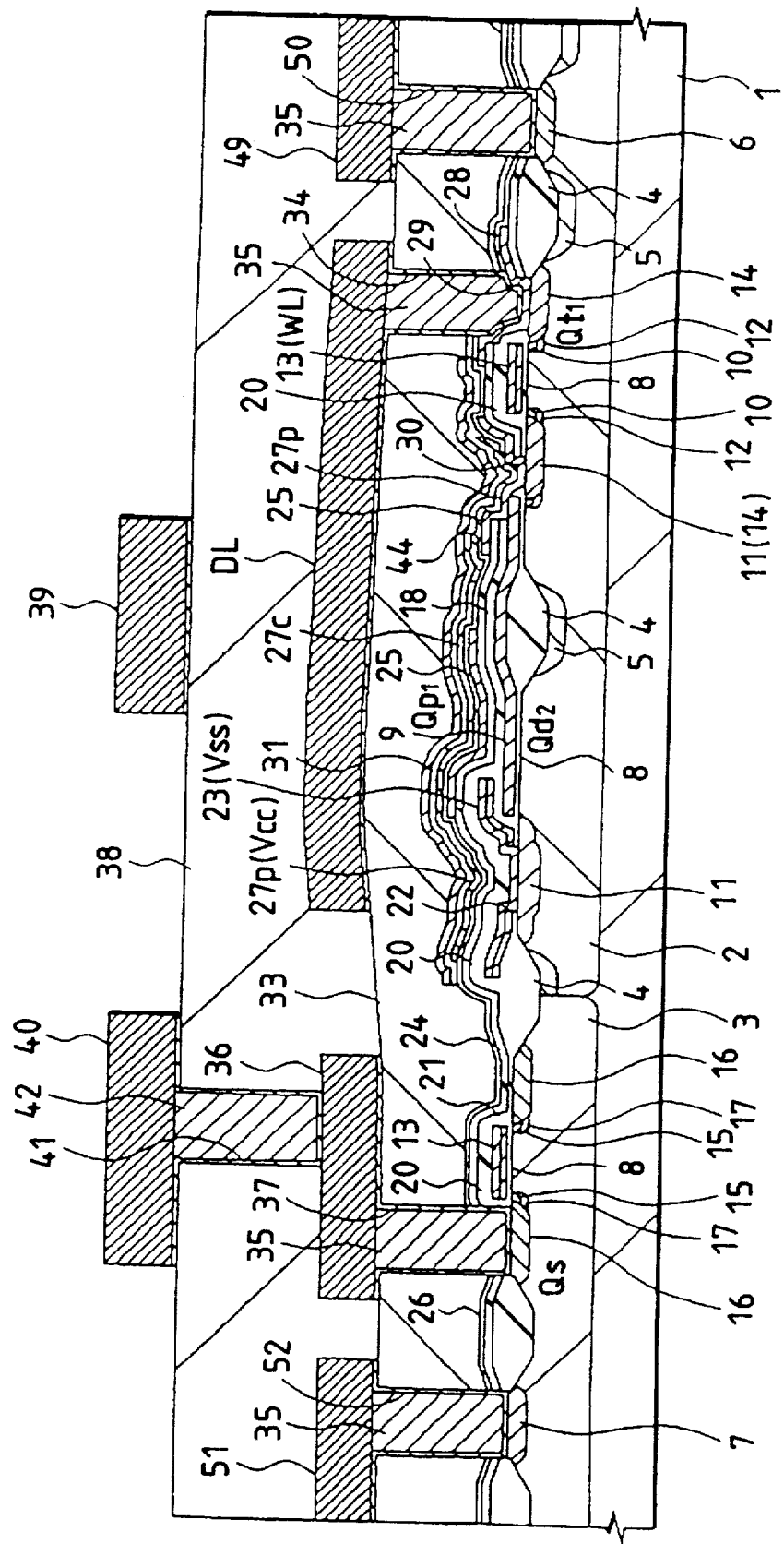
FIG. 23 is a sectional view of the principal part illustrative of the process for producing the SRAM according to the present invention.
Figure 25:
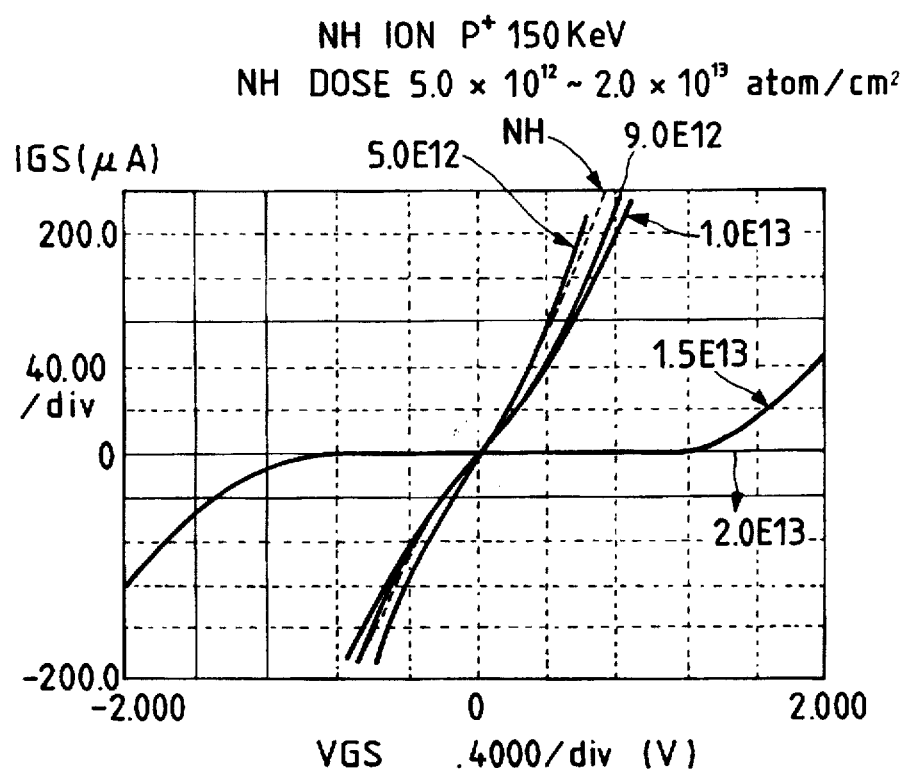
FIG. 25 is a graph showing the impurity dosage dependence of conducting properties (I–V curve).
Figure 26:
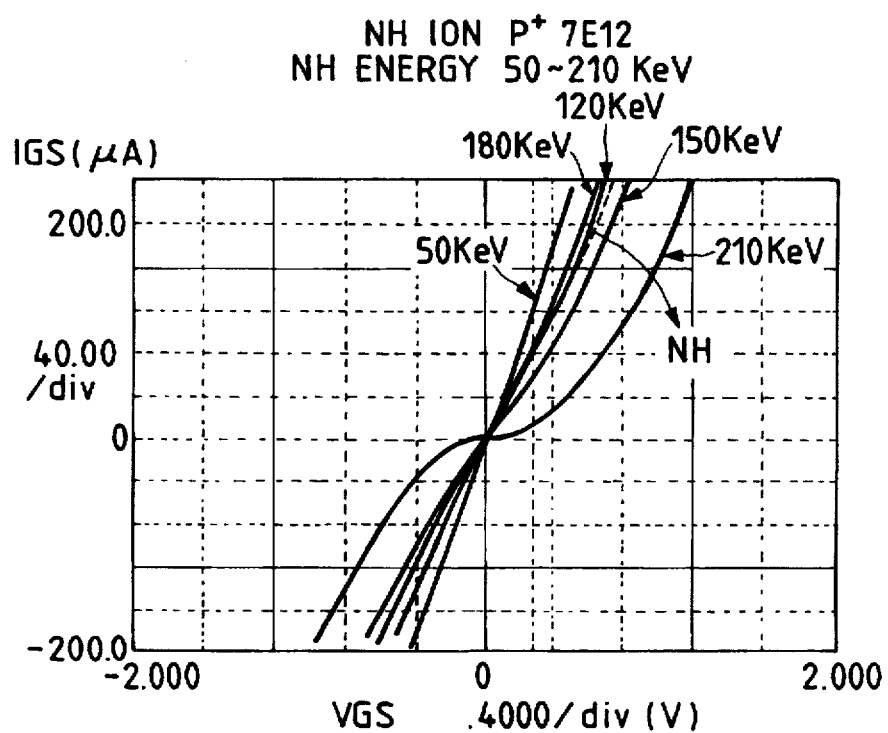
FIG. 26 is a graph showing the impurity dose energy dependence of conducting properties (I–V curve).
Figure 27:
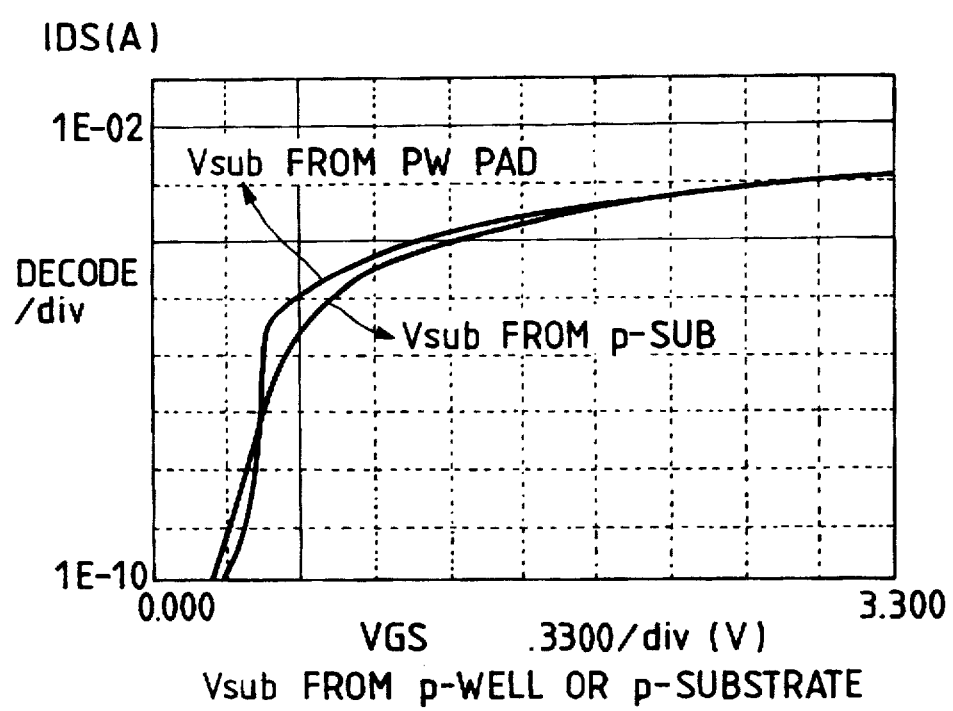
FIG. 27 is a graph showing the well potential supply dependence of the subthreshold characteristics (I–V curve).
Figure 28A:
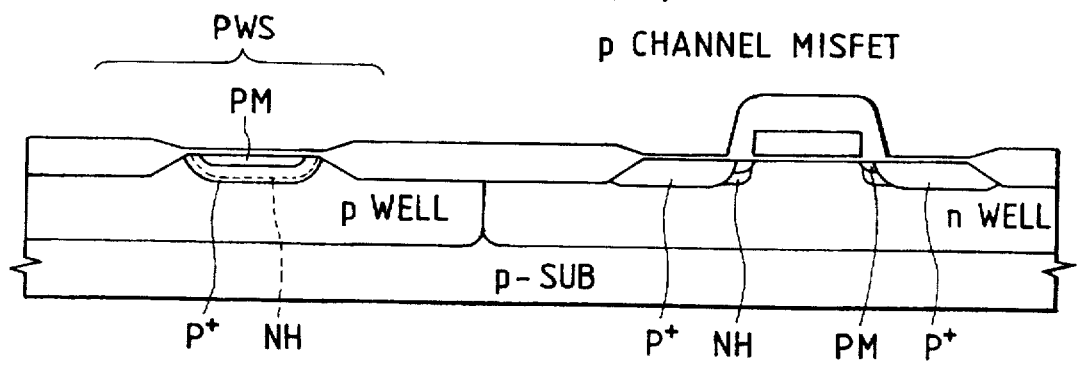
FIGS. 28($a$), 28($b$), 28($c$) are diagrams descriptive of semiconductor regions formed in the feeding portion of a p-type well.
Figure 28B:
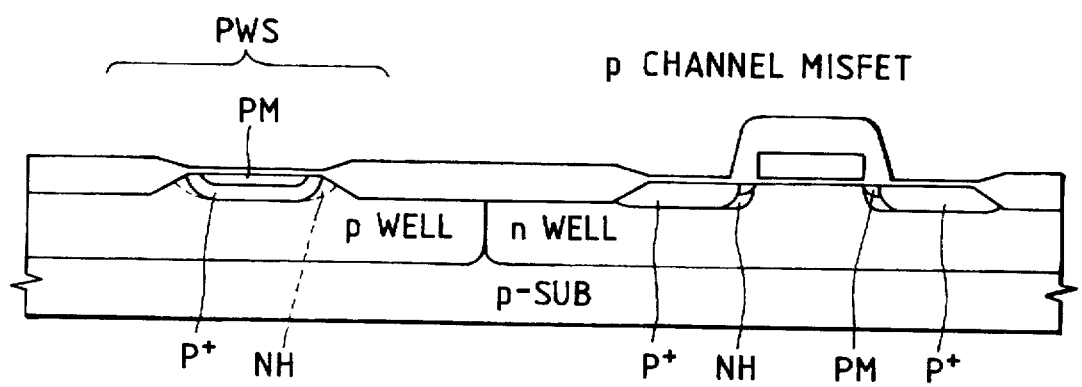
Figure 28C:
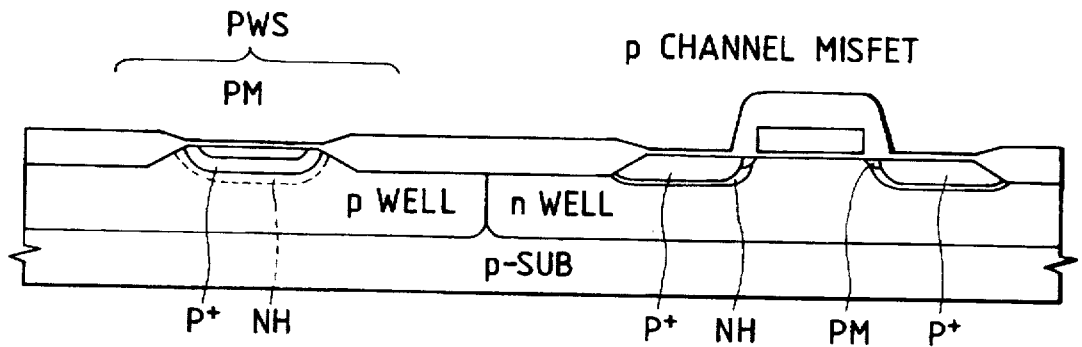

Subsequently, as shown in FIG. 23, the layer-to-layer insulating film 38 is formed on the complementary data lines (data lines DL, $\overline{DL}$) and the wiring 36, 49, 51 and then the connection hole 42 is formed by etching the layer-to-layer insulating film 38. Further, the wiring 39, 40 are formed by patterning the second-layer wiring material stacked by sputtering on the layer-to-layer insulating film 38. The wiring 40 is connected through the connection hole 42 to the wiring 36. The layer-to-layer insulating film 38, the silicon oxide film, and spin-on glass film and the silicon oxide film are successively stacked. The silicon oxide film is formed through the plasma CVD method, whereas the spin-on film is formed through the spin coating method. Further, the same material as that of the first-layer wiring material is used to form the wiring 39, 40.

Further, the silicon oxide film and the silicon nitride film are alternately and successively stacked on the wiring 39, 40 through the plasma CVD method to form the final passivation film 43, whereby the SRAM shown in FIG. 1 according to this embodiment of the invention is completed.

Although a detailed description has been given of the embodiment of the present invention made by the present inventors, the present invention is not limited to the aforesaid embodiment thereof but may be modified without departing the scope and spirit of the invention.

According to this embodiment of the invention, it has been so arranged that the source and drain regions of the p-channel type MISFET of the peripheral circuit and the n-channel type MISFET are those which are of LDD structure and that the third semiconductor region is formed beneath the semiconductor region of low impurity concentration forming part of the source and drain regions, the third semiconductor region being different in conductivity type from the latter semiconductor region and higher in impurity concentration than the well. However, it may be unnecessary to form the third semiconductor region beneath the semiconductor region of low impurity concentration for the p-channel type MISFET or the n-channel type MISFET of the peripheral circuit which is required to operate at high speed, for example. In this case, the high-speed operation of the peripheral circuit is not interfered with since to increase in the pn junction capacitance is caused even though the third semiconductor region is provided.

Although a description has been given of a case where the present invention has been applied to the SRAM having the loading MISFETs Qp1, Qp2 formed of the polycrystal silicon films, the invention is not limited to that case above but may be applied to a SRAM having a loading resistor formed of such a polycrystal silicon film and a bulk CMOS type SRAM with loading MISFETs as well as driving and transfer MISFETs each formed on a semiconductor substrate. Moreover, the present invention may widely be applied to not only SRAMs but also semiconductor integrated circuits having MISFETs.

A brief description will subsequently be given of the effect that can be achieved by the representative embodiment of the present invention.

According to the present invention, it is realizable to increase the performance of semiconductor integrated circuits having MISFETs since not only the latchup property deterioration of the feeding portion but also the floating of the substrate thereof is preventable.

According to the present invention, further, the high-speed operation of MISFETs is achievable since the parasitic capacitance formed between the semiconductor region and the substrate is reducible.

According to the present invention, further, it is possible to prevent not solely the latchup property deterioration of the feeding portion but also the floating of the substrate thereof without increasing the number of processing steps.

According to the present invention, further, the short channel effect and the punch-through of the MISFET can be suppressed by providing the source and drain regions of the MISFET as those which are of LDD structure and a third semiconductor region beneath a semiconductor region of low impurity concentration forming part of the source and drain regions, the third semiconductor region being different in conductivity type from the latter semiconductor region and higher in impurity concentration than the substrate (well).

What is claimed is:

1. A process for producing a semiconductor integrated circuit, comprising the steps of:

(a) providing a semiconductor substrate having a first semiconductor region of a first conductivity type and a second semiconductor region of a second conductivity type, the semiconductor substrate having a first gate electrode of a first MISFET on a first MISFET forming area of the first semiconductor region, with a first gate insulating film of the first MISFET between the first gate electrode and the first MISFET forming area, and a second gate electrode of a second MISFET on a second MISFET forming area of the second semiconductor region, with a second gate insulating film of the second MISFET between the second gate electrode and the second MISFET forming area;

(b) forming third semiconductor regions of the second conductivity type in the first semiconductor region on both sides of the first gate electrode by introducing an impurity into the first MISFET forming area with a first mask film covering a feeding-portion forming area of the second semiconductor region and the second MISFET forming area as a mask;

(c) forming fourth semiconductor regions of the first conductivity type in the first semiconductor region and beneath the third semiconductor regions by introducing an impurity into the first MISFET forming area with the first mask film as a mask, an impurity concentration of the fourth semiconductor regions being higher than that of the first semiconductor region; and (d) forming fifth semiconductor regions of the second conductivity type in the first semiconductor region on both sides of the first gate electrode and a sixth semiconductor region of the second conductivity type in the feeding-portion forming area of the second semiconductor region by introducing an impurity into the first MISFET forming area and the feeding-portion forming area of the second semiconductor region with a second mask film covering the second MISFET forming area and having an opening over the feeding-portion forming area of the second semiconductor region as a mask, wherein the third semiconductor region is formed, in the first semiconductor region, between one of the fifth semiconductor regions and a channel forming area of the first MISFET, wherein an impurity concentration of the fifth semiconductor regions is higher than that of the third semiconductor regions, wherein an impurity concentration of the sixth semiconductor region is higher than that of the second semiconductor region, and wherein a first fixed potential is supplied through the sixth semiconductor region to the second semiconductor region.

2. A process for producing a semiconductor integrated circuit according to claim 1, further comprising the steps of:
   (e) forming seventh semiconductor regions of the first conductivity type in the second semiconductor region on both sides of the second gate electrode by introducing an impurity into the second MISFET forming area with a third mask film covering the first MISFET forming area and the feeding-portion forming area of the second semiconductor region as a mask; and
   (f) forming eighth semiconductor regions of the first conductivity type in the second semiconductor region on both sides of the second gate electrode and a ninth semiconductor region of the second conductivity type in the feeding-portion forming area of the first semiconductor region by introducing an impurity into the second MISFET forming area and the feeding-portion forming area of the second semiconductor region with a fourth mask film covering both the first MISFET forming area and the feeding-portion forming area of the second semiconductor region and having an opening over the feeding-portion forming area of the first semiconductor region as a mask,
   wherein one of the seventh semiconductor regions is formed between one of the eighth semiconductor regions and the channel forming area of the second MISFET,
   wherein the impurity concentration of the eighth semiconductor region is higher than that of the seventh semiconductor region,
   wherein the impurity concentration of the ninth semiconductor region is higher than that of the first semiconductor region, and
   wherein a second fixed potential is supplied through the ninth semiconductor region to the first semiconductor region.

3. A process for producing a semiconductor integrated circuit according to claim 2, further comprising the step of:
   (g) forming tenth semiconductor regions of the second conductivity type in the first semiconductor region and beneath the seventh semiconductor regions by introducing an impurity into the second MISFET forming area with the third mask film as a mask,
   the impurity concentration of the tenth semiconductor regions being higher than that of the second semiconductor region.

4. A process for producing a semiconductor integrated circuit according to claim 1, wherein the bottom portion of the fourth semiconductor regions is made substantially equal in depth to that of the fifth semiconductor regions.

5. A process for producing a semiconductor integrated circuit according to claim 2, wherein bottom portion of the fourth semiconductor regions is made substantially equal in depth to that of the fifth semiconductor regions.

6. A process for producing a semiconductor integrated circuit according to claim 2, wherein the first conductivity type is a p type, whereas the second conductivity type is an n type.

7. A process for producing a semiconductor integrated circuit according to claim 3, wherein the first mask film covers the feeding-portion forming area of the first semiconductor region, and wherein the second mask film covers the feeding-portion forming area of the first semiconductor region.

8. A process for producing a semiconductor integrated circuit according to claim 2, further comprising the step of: forming first side wall spacers on side surfaces of the first gate electrode and second side wall spacers on side surfaces of the second gate electrode,
   wherein the fifth semiconductor regions are formed in self-alignment with the first side wall spacers, and
   wherein the eighth semiconductor regions are formed in self-alignment with the second side wall spacers.

9. A process for producing a semiconductor integrated circuit according to claim 8, wherein the third semiconductor regions are formed in self-alignment with the first gate electrode, and wherein the seventh semiconductor regions are formed in self-alignment with the second gate electrode.

10. A process for producing a semiconductor integrated circuit, comprising the steps of:
   (a) providing a semiconductor substrate having a first semiconductor region of a first conductivity type and a second semiconductor region of a second conductivity type, the semiconductor substrate having a first MISFET forming area, where a first MISFET is to be formed, on the first semiconductor region and a second MISFET forming area, where a second MISFET is to be formed, on the second semiconductor region, a first gate electrode of the first MISFET being formed on the first MISFET forming area of the first semiconductor region with a first gate insulating film of the first MISFET between the first gate electrode and the first MISFET forming area;
   (b) forming third semiconductor regions of the second conductivity type in the first semiconductor region, on both sides of the first gate electrode, by introducing an impurity into the first MISFET forming area with a first mask film covering the second MISFET forming area as a mask;
   (c) forming fourth semiconductor regions of the first conductivity type in the first semiconductor region and beneath the third semiconductor region by introducing an impurity into the first MISFET forming area with a second mask film covering the second MISFET forming area and a feeding-portion forming area of the second semiconductor region as a mask, an impurity concentration of the fourth semiconductor regions being higher than that of the first semiconductor region; and
   (d) forming fifth semiconductor regions of the second conductivity type in the first semiconductor region on both sides of the first gate electrode and a sixth semiconductor region of the second conductivity type in the feeding-portion forming area of the second semiconductor region by introducing an impurity into the first MISFET forming area and the feeding-portion forming area of the second semiconductor region with a third mask film covering the second MISFET forming area and having an opening over the feeding-portion forming areas of the second semiconductor region as a mask,
   wherein one of the third semiconductor regions is formed, in the first semiconductor region, between one of the fifth semiconductor regions and a channel forming area of the first MISFET,
   wherein an impurity concentration of the fifth semiconductor regions is higher than that of the third semiconductor regions,
   wherein an impurity concentration of the sixth semiconductor region is higher than that of the second semiconductor region, and
   wherein a first fixed potential is supplied through the sixth semiconductor region to the second semiconductor region.

11. A process for producing a semiconductor integrated circuit according to claim 10, wherein the first mask film covers a feeding-portion forming area of the first semiconductor region, and wherein the third mask film covers the feeding-portion forming area of the first semiconductor region.

12. A process for producing a semiconductor integrated circuit according to claim 10, wherein the first conductivity type is p type, and wherein the second conductivity type is n type.

13. A process for producing a semiconductor integrated circuit according to claim 10, further comprising the step of:

forming side wall spacers on side surfaces of the first gate electrode and the second gate electrode, wherein the fifth semiconductor regions are formed in self-alignment with the first gate electrode.

14. A process for producing a semiconductor integrated circuit according to claim 13, wherein the third semiconductor regions are formed in self-alignment with the first gate electrode.

15. A process for producing a semiconductor integrated circuit according to claim 10, further comprising the steps of:

(e) forming seventh semiconductor regions of the first conductivity type in the second semiconductor region on both sides of the second gate electrode by introducing an impurity into the second MISFET forming area with a fourth mask film covering the first MISFET forming area and the feeding-portion forming area of the second semiconductor region as a mask; and (f) forming eighth semiconductor regions of the first conductivity type in the second semiconductor region on both sides of the second gate electrode and a ninth semiconductor region of the second conductivity type in the feeding-portion forming area of the first semiconductor region by introducing an impurity into the second MISFET forming area and the feeding-portion forming area of the second semiconductor region with a fifth mask film covering both the first MISFET forming area and the feeding-portion forming area of the second semiconductor region and having an opening over the feeding-portion forming area of the first semiconductor region as a mask, wherein one of the seventh semiconductor regions is formed between one of the eighth semiconductor regions and a channel forming area of the second MISFET, wherein the impurity concentration of the eighth semiconductor regions is higher than that of the seventh semiconductor regions, wherein the impurity concentration of the ninth semiconductor region is higher than that of the first semiconductor region, and wherein a second fixed potential is supplied through the ninth semiconductor region to the first semiconductor region.

16. A process for producing a semiconductor integrated circuit, comprising the steps of:

(a) providing a semiconductor substrate having a first semiconductor region of a first conductivity type and a second semiconductor region of a second conductivity type, the semiconductor substrate having a first MISFET forming area, where a first MISFET is to be formed, on the first semiconductor region and a second MISFET forming area, where a second MISFET is to be formed, on the second semiconductor region, a first gate electrode of the first MISFET being formed on the first MISFET forming area of the first semiconductor region with a first gate insulating film of the first MISFET between the first gate electrode and the first MISFET forming area;

(b) forming third semiconductor regions of the first conductivity type in the first semiconductor region on both sides of the first gate electrode by introducing an impurity into the first MISFET forming area with a first mask film covering the second MISFET forming area and a feeding-portion forming area of the second semiconductor region as a mask, an impurity concentration of the third semiconductor regions being higher than that of the first semiconductor region; and (c) forming fourth semiconductor regions of the second conductivity type in the first semiconductor region on both sides of the first gate electrode and a fifth semiconductor region of the second conductivity type in the feeding-portion forming area of the second semiconductor region by introducing an impurity into the first MISFET forming area and the feeding-portion forming area of the second semiconductor region with a second mask film covering the second MISFET forming area and having an opening over the feeding-portion forming area of the second semiconductor region as a mask, wherein an impurity concentration of the fifth semiconductor region is higher than that of the second semiconductor region, and wherein a first fixed potential is supplied through the fifth semiconductor region to the second semiconductor region.

17. A process for producing a semiconductor integrated circuit according to claim 16, wherein the first conductivity type is p type, and wherein the second conductivity type is n type.

18. A process for producing a semiconductor integrated circuit according to claim 16, wherein the first conductivity type is n type, and wherein the second conductivity type is p type.

19. A process for producing a semiconductor integrated circuit according to claim 16, further comprising the step of:

forming side wall spacers on side surfaces of the first gate electrode and a second gate electrode, wherein the fourth semiconductor regions are formed in self-alignment with the side wall spacers.

20. A process for producing a semiconductor integrated circuit according to claim 19, further comprising the step of:

forming sixth semiconductor regions of the second conductivity type in the first semiconductor region on both sides of the first gate electrode by introducing an impurity into the first MISFET forming area with the first mask film as a mask, wherein one of the sixth semiconductor regions is formed, in the first semiconductor region, between one of the fourth semiconductor regions and a channel forming area of the first MISFET, and wherein an impurity concentration of the fourth semiconductor regions is higher than that of the sixth semiconductor regions.

* * * * *